United States Patent
Verma et al.

(10) Patent No.: US 9,087,906 B2
(45) Date of Patent: Jul. 21, 2015

(54) GROUNDING OF SILICON-ON-INSULATOR STRUCTURE

(71) Applicant: GLOBALFOUNDRIES Singapore Pte. Ltd., Singapore (SG)

(72) Inventors: Purakh Raj Verma, Singapore (SG); Shaoqiang Zhang, Singapore (SG); Bo Yu, Singapore (SG); Guan Huei See, Singapore (SG); Rui Tze Toh, Singapore (SG); Tao Jiang, Singapore (SG)

(73) Assignee: GLOBALFOUNDRIES SINGAPORE PTE. LTD. (SG)

( * ) Notice: Subject to any disclaimer, the term of this patent is extended or adjusted under 35 U.S.C. 154(b) by 0 days.

(21) Appl. No.: 14/505,483

(22) Filed: Oct. 2, 2014

(65) Prior Publication Data

US 2015/0097240 A1   Apr. 9, 2015

Related U.S. Application Data

(60) Provisional application No. 61/866,659, filed on Oct. 4, 2013.

(51) Int. Cl.
*H01L 29/786* (2006.01)
*H01L 29/66* (2006.01)
*H01L 21/02* (2006.01)

(52) U.S. Cl.
CPC .... *H01L 29/78657* (2013.01); *H01L 21/02381* (2013.01); *H01L 21/02422* (2013.01); *H01L 29/66477* (2013.01)

(58) Field of Classification Search
CPC .................................................. H01L 29/78657
See application file for complete search history.

(56) References Cited

U.S. PATENT DOCUMENTS

| | | | |
|---|---|---|---|
| 6,153,912 A | 11/2000 | Holst | |
| 6,521,947 B1 | 2/2003 | Ajmera et al. | |
| 8,709,890 B2 | 4/2014 | Cheng et al. | |
| 2007/0007595 A1 | 1/2007 | Hirano et al. | |
| 2014/0191322 A1 | 7/2014 | Botula et al. | |
| 2014/0213053 A1 | 7/2014 | Nummy et al. | |

*Primary Examiner* — David Vu
(74) *Attorney, Agent, or Firm* — Horizon IP Pte. Ltd.

(57) ABSTRACT

Devices and methods for forming a device are presented. The method includes providing a substrate having at least a first region and a second region prepared with isolation regions. The first region is referred to as a chip guarding area and the second region defines a chip region of which at least one transistor is to be formed. The substrate includes a top surface layer, a support substrate and an insulator layer in between them. A transistor is formed in the second region and a substrate contact structure is formed in the first region. The substrate contact structure passes through at least the top surface layer, insulator layer and isolation region and contacts a doped region in the support substrate. The substrate contact structure is connected to at least one conductive line with a desired potential to prevent charging of the support substrate at system level.

23 Claims, 22 Drawing Sheets

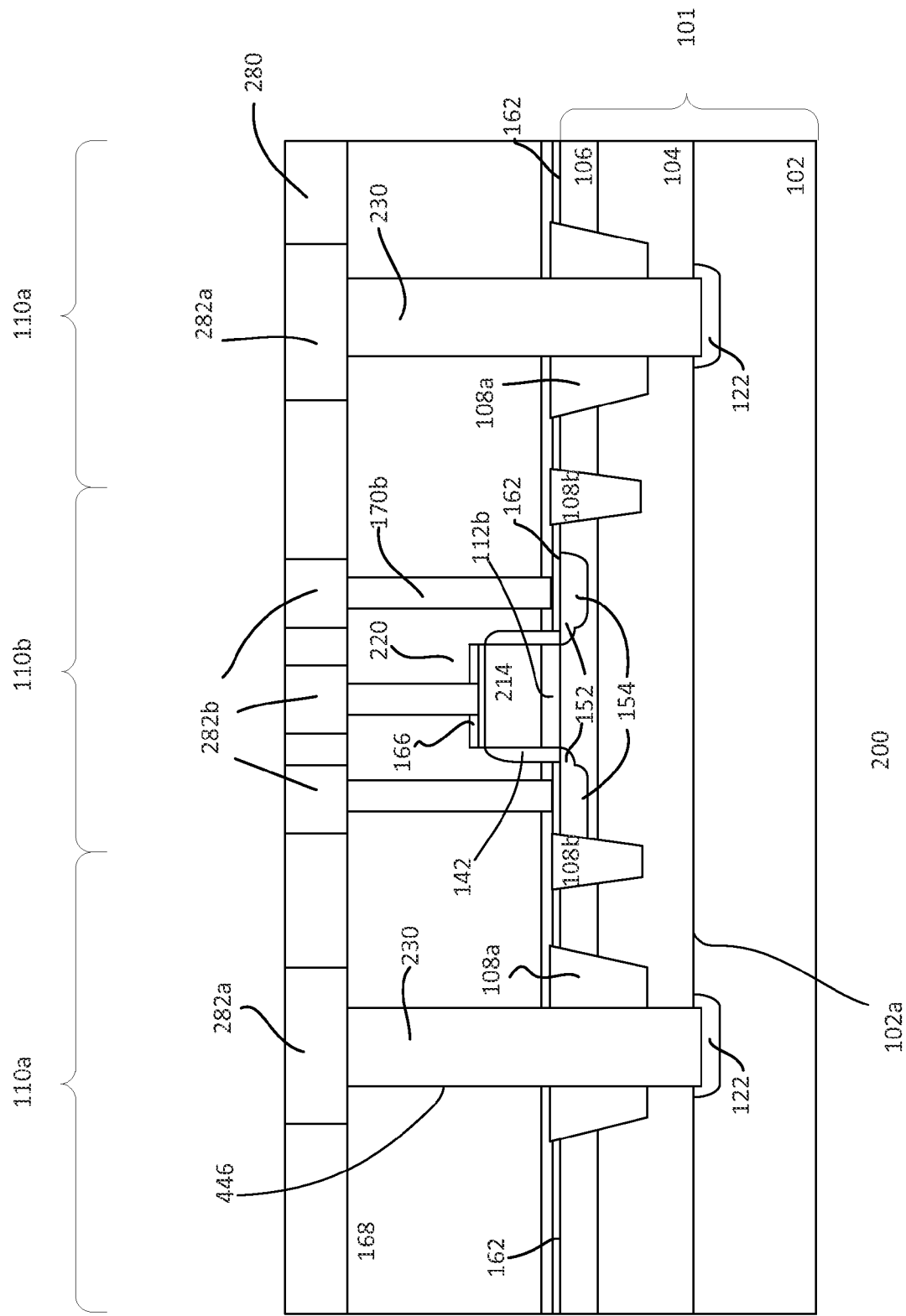

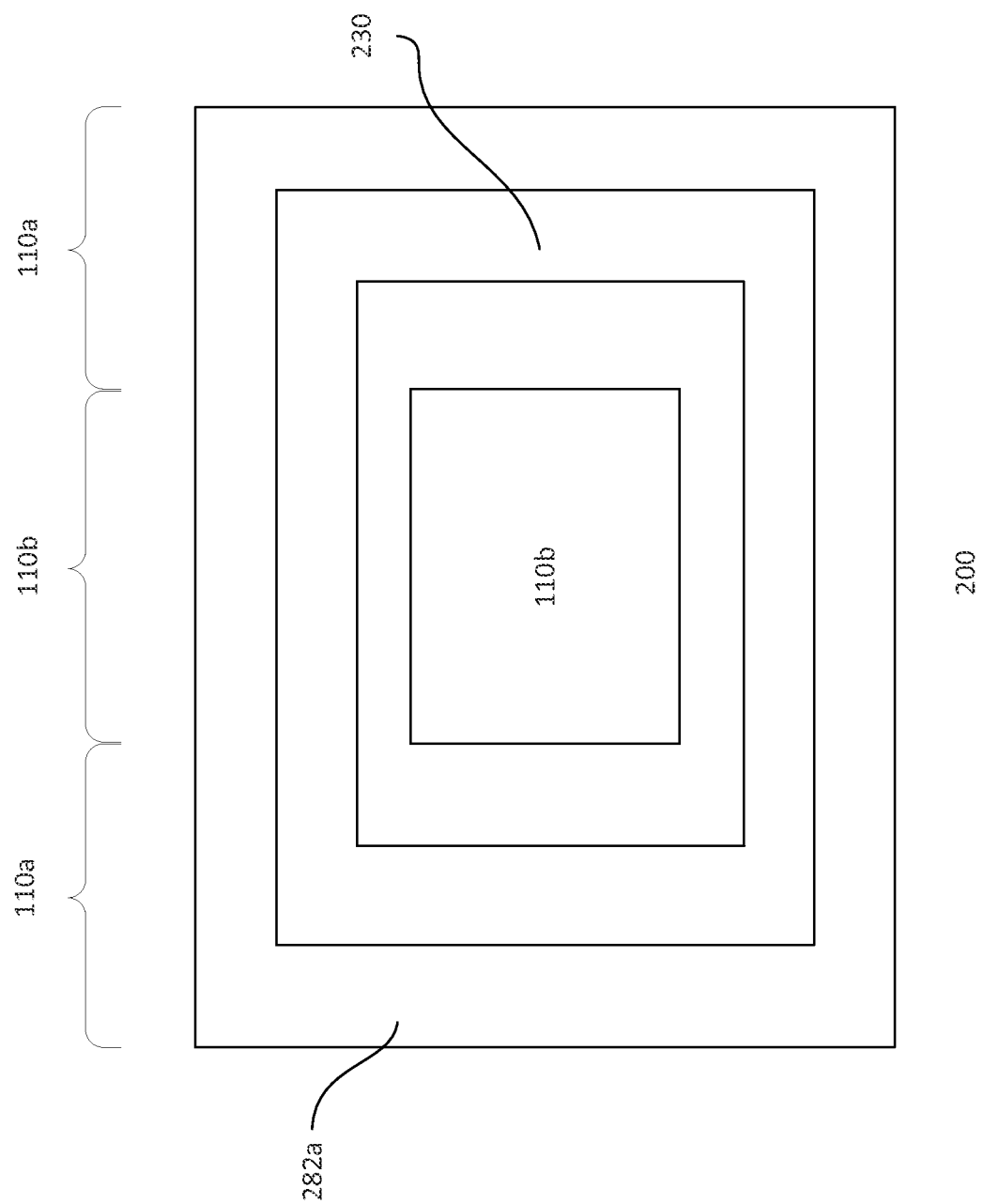

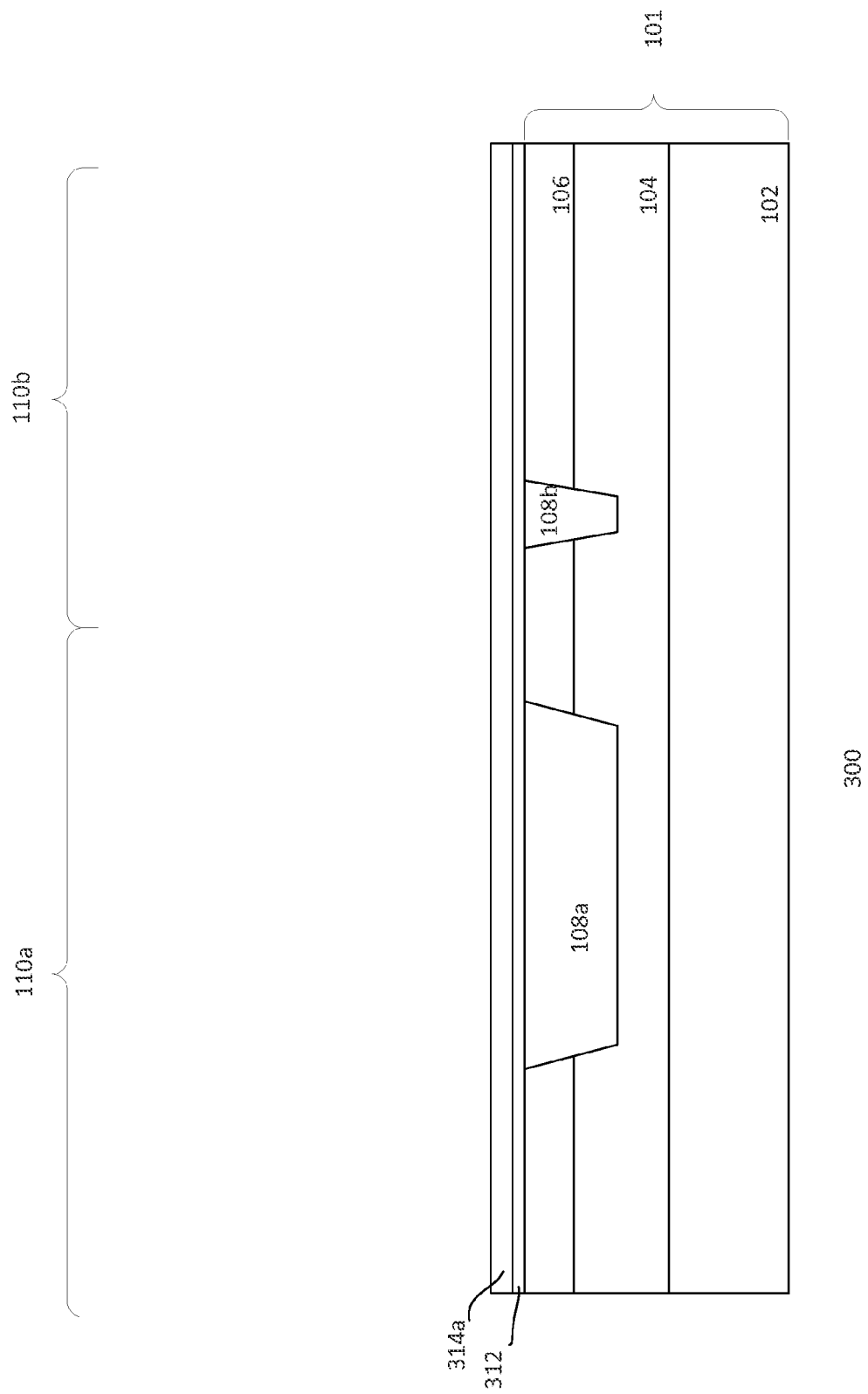

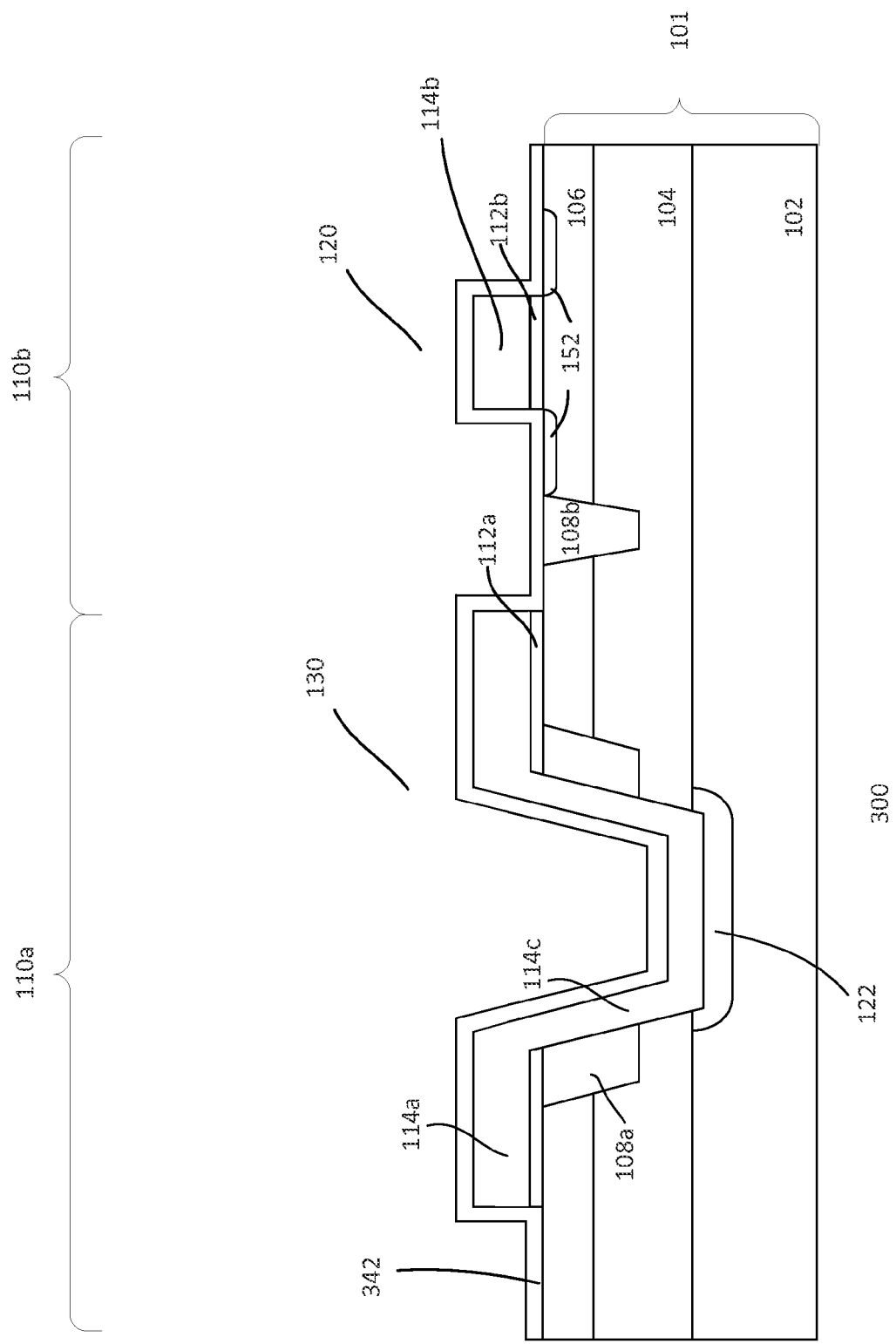

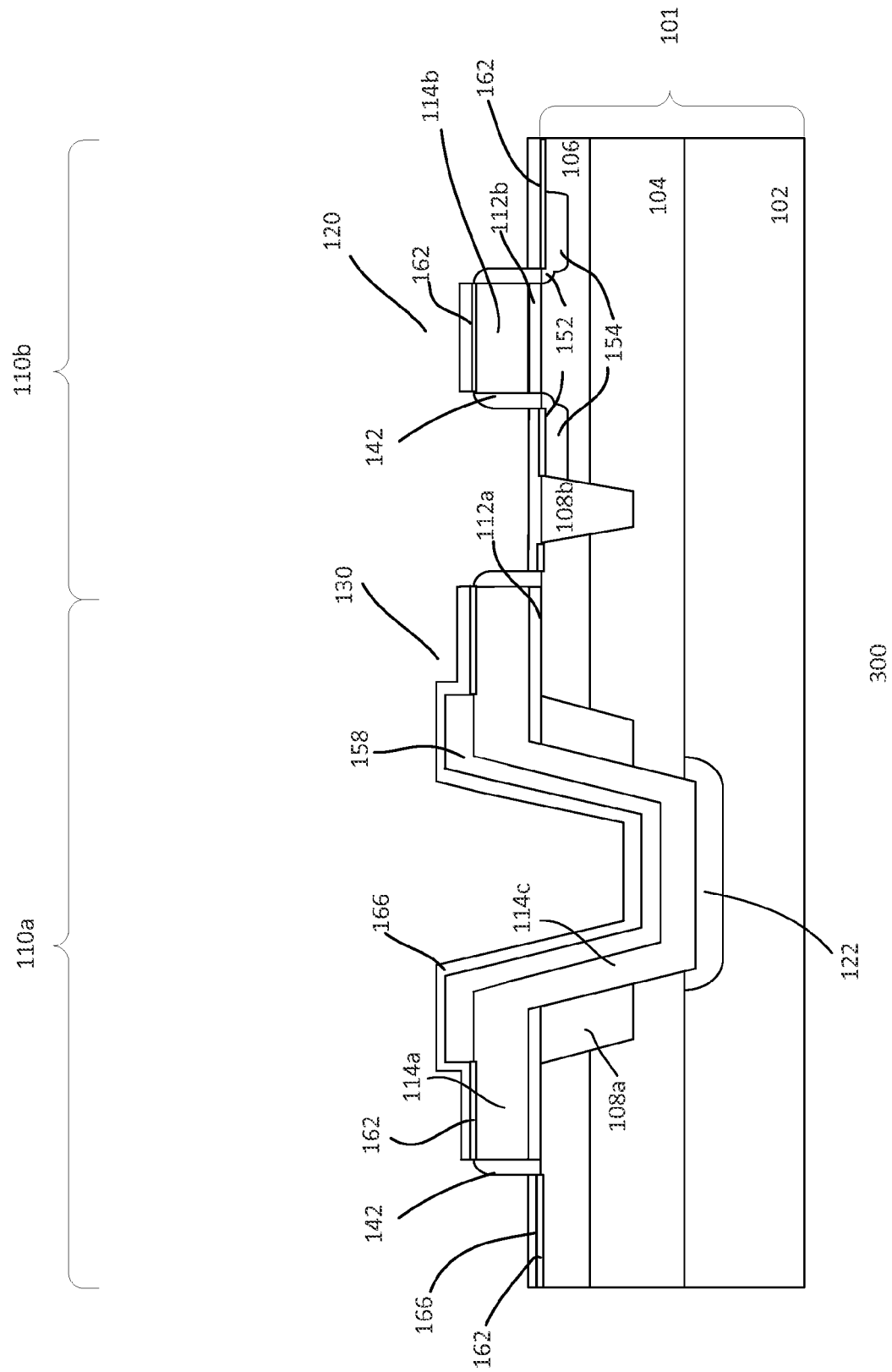

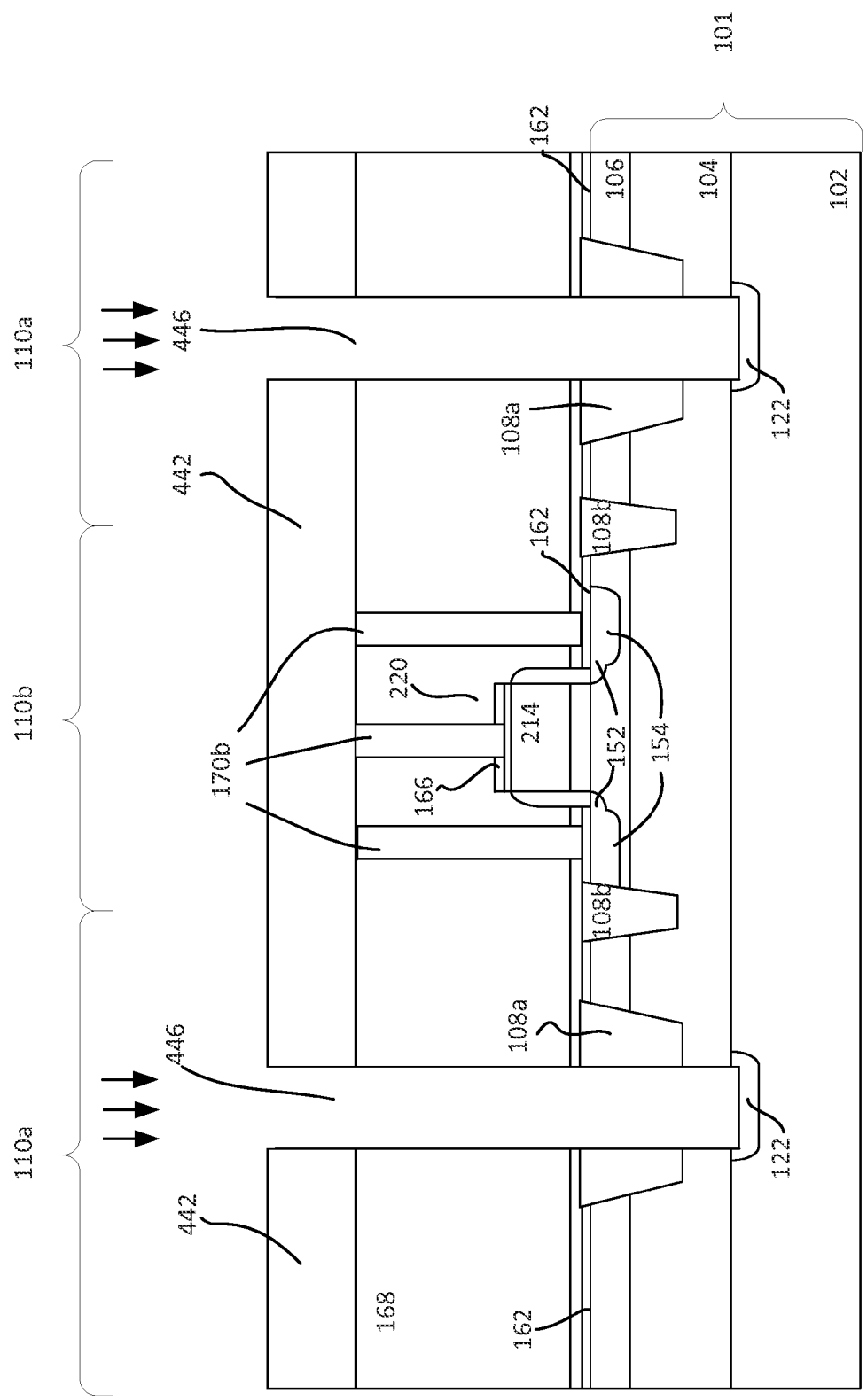

GROUNDING OF SILICON-ON-INSULATOR STRUCTURE

CROSS-REFERENCE TO RELATED APPLICATION

This application claims the priority benefit of U.S. Provisional Application Ser. No. 61/886,659, filed on Oct. 4, 2013, which is herein incorporated by reference in its entirety.

BACKGROUND

Some semiconductor devices employ silicon-on-insulator (SOI) in place of conventional single layer semiconductor substrate in semiconductor manufacturing, especially in microelectronics, to reduce parasitic device capacitance such that device performance can be improved. SOI substrate includes a top silicon (Si) surface layer separated from a support or "handle" Si substrate by an insulator layer. The insulator layer includes, for example, silicon dioxide, and is usually referred to as the buried oxide (BOX) layer. Components or devices, such as transistors, are formed in the top Si surface layer and the insulator layer isolates the top Si surface layer from the support Si substrate. Typically, the support Si substrate of the SOI substrate is not electrically connected to any other structure. The support Si substrate of the SOI substrate, thus, is in a "floating" configuration and static charges may easily build up in the support Si substrate during normal chip operation. These static charges may undesirably disturb the normal operation of the chips or devices.

The disclosure is directed to grounding of the SOI substrate such that normal operations of the chip will not be affected.

SUMMARY

Embodiments generally relate to semiconductor devices and methods for forming a device. In one embodiment, a method of forming a device is disclosed. The method includes providing a substrate having at least a first region and a second region prepared with isolation regions. The first region is referred to as a chip guarding area and the second region defines a chip region of which at least one transistor is to be formed. The substrate includes a top surface layer, a support substrate and an insulator layer isolating the top surface layer from the support substrate. At least one transistor is formed in the second region of the substrate and at least one substrate contact structure is formed in the first region of the substrate. The substrate contact structure passes through at least the top surface layer, insulator layer and isolation region and contacts a doped region in the support substrate in the first region of the substrate. The substrate contact structure is connected to at least one conductive line with a desired potential to prevent charging of the support substrate at system level.

In one embodiment, a method of forming a device is disclosed. The method includes providing a substrate having at least a first region and a second region prepared with isolation regions. The first region is referred to as a chip guarding area and the second region defines a chip region of which at least one transistor is to be formed. The substrate includes a top surface layer, a support substrate and an insulator layer isolating the top surface layer from the support substrate. At least one transistor is formed in the second region of the substrate and at least one substrate contact structure is formed in the first region of the substrate. The substrate contact structure passes through at least the top surface layer, insulator layer and isolation region and contacts a doped region in the support substrate in the first region of the substrate. The substrate contact structure is connected to at least one conductive line with a desired potential to prevent charging of the support substrate at system level.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and per mutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIG. 2a shows cross-sectional view of another embodiment of a device and FIG. 2b shows a simplified top view of the device;

FIGS. 3a-3k show an embodiment of a process for forming a device; and

FIGS. 4a-4g show another embodiment of a process for forming a device.

DETAILED DESCRIPTION

Embodiments generally relate to semiconductor devices or integrated circuits (ICs) and methods for forming a device. Such devices, for example, may include radio frequency (RF) devices. The devices employ a silicon-on-insulator (SOI) substrate which is grounded such that normal operations of the chips or active devices will not be affected. The devices or ICs can be incorporated into or used with, for example, consumer electronic products, particularly portable consumer products, such as cell phones, laptop computers and personal digital assistants (PDAs) or other types of devices.

Figure 1A:
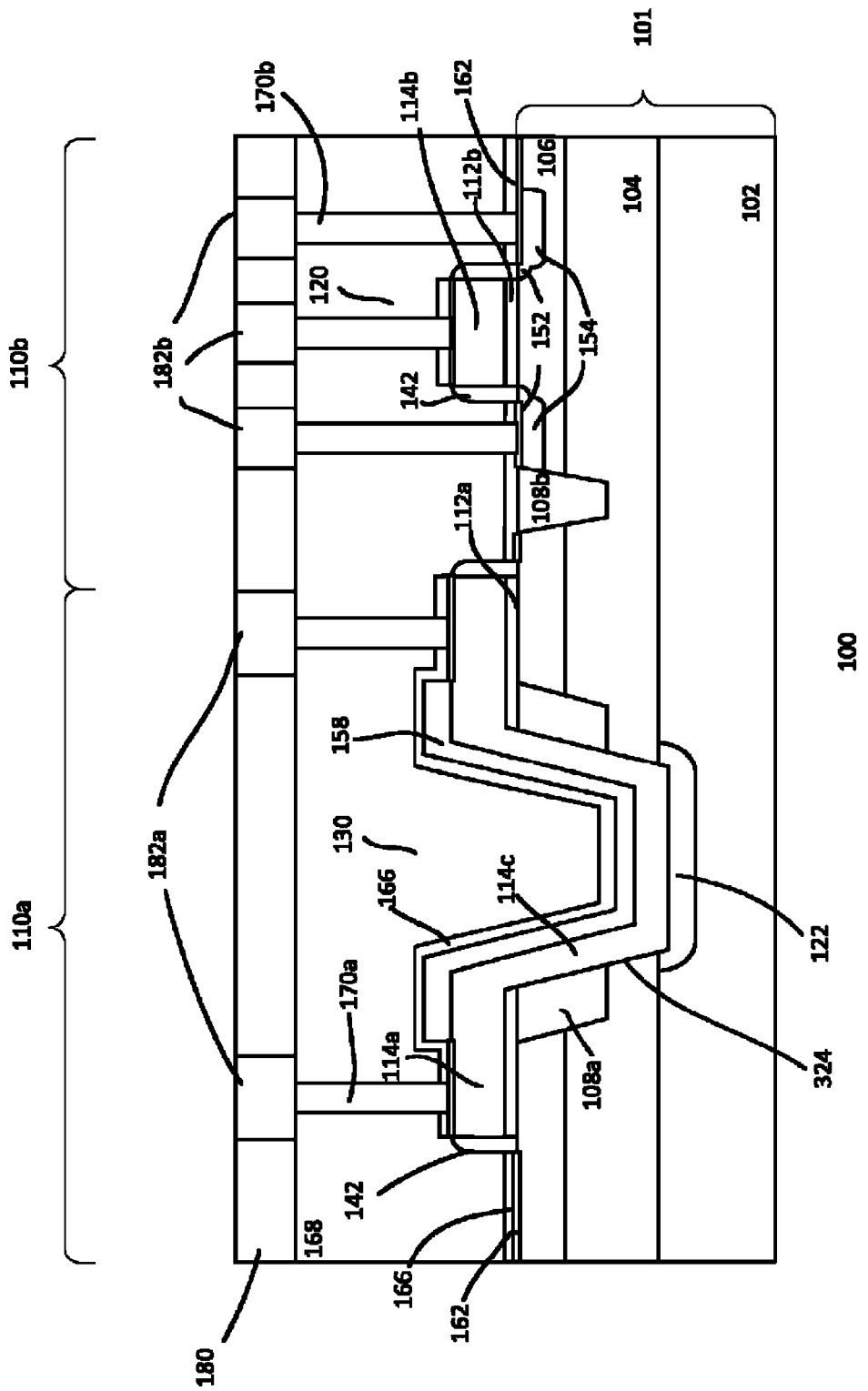
FIG. 1a shows cross-sectional view of an embodiment of a device and FIG. 1b shows a simplified top view of a first region of the device.

FIG. 1a shows a cross-sectional view of a portion of an embodiment of a device 100. The device, for example, is an integrated circuit (IC). Other types of devices may also be useful. As shown, the device includes a substrate 101. The substrate, for example, includes a top surface layer 106 separated from a support substrate 102 by an insulator layer 104.

For illustration, the support or "handle" substrate 102 of the substrate 101 includes a semiconductor material. The semiconductor material, for example, includes single crystalline silicon (Si). Other suitable types of substrate materials or any other suitable semiconductor materials may also be useful. The thickness of the support substrate, for example, is about 775 µm. Other suitable thicknesses may also be useful. The support substrate, for example, may be lightly doped with first polarity type dopants, such as p-type dopants. Providing the support substrate which is lightly doped with second polarity type dopants, such as n-type dopants, may also be useful. P-type dopants may include boron (B), aluminum (Al), indium (In) or a combination thereof, while n-type dopants may include phosphorous (P), arsenic (As), antimony (Sb) or a combination thereof. The support substrate, for example, serves as a back plate for the substrate 101.

The insulator layer 104, for example, includes a dielectric insulating material. The insulator layer, for example, is formed from silicon oxide, providing a buried oxide (BOX) layer. Other suitable types of dielectric insulating materials may also be useful. The thickness of the insulator layer, for example, is about 0.1-1 µm. Other suitable thicknesses and materials for the insulator layer may also be useful.

The top surface layer 106 of the substrate 101, as shown in FIG. 1a, includes a semiconductor material. The semiconductor material, for example, includes single crystalline Si. In this case, the top surface layer 106 may be referred to as the top Si layer and the substrate 101 is a silicon-on-insulator (SOI) substrate. Other suitable types of substrate materials or any other suitable semiconductor materials may also be useful. In one embodiment, the top surface layer and the support substrate include the same material. The top surface layer and the support substrate may also include different materials. The thickness of the top surface layer, for example, is about 0.05-0.2 µm. Other suitable thicknesses may also be useful.

Referring to FIG. 1a, the substrate 101 includes at least a first region 110a and a second region 110b. The first region, as shown, is disposed adjacent to the second region. The first region 110a, for example, may be referred to as a chip guarding area while the second region 110b, for example, defines a chip region or area of which ICs, such as functional ICs which include transistors, are to be formed. For illustration, one first region and one second region are shown in FIG. 1a. It is understood that the substrate may include other numbers of first and second regions and various types of regions (not shown). For example, the substrate may include other device regions for other types of devices.

The regions are separated from other regions by isolation regions. The isolation regions are, for example, shallow trench isolation (STI) regions. In one embodiment, the STI regions extend from top surface of the op Si layer to a portion of the insulator layer. The depth of the STI regions may be, for example, about 0.05-0.2 µm. Other suitable depth dimensions for the STI regions may also be useful. In other embodiments, the isolation regions may be other types of isolation regions. The isolation region 108a in the first region 110a, for example, may be wider than the isolation region 108b in the second region 110b. The width of the isolation region 108a, for example, may include any suitable width dimension which is sufficiently wide to accommodate a substrate contact opening as will be described later.

As shown in FIG. 1a, the device includes at least one transistor 120 disposed the second region. The transistor includes a gate on the top Si layer of the substrate. The width of the gate along a channel length direction of the transistor, for example, depends on technology node. Usually, only the minimum channel length is defined. For example, the minimum gate width for 0.13 µm technology node is about 0.13 µm. The gate, for example, includes a gate electrode 114b over a gate dielectric 112b. The gate dielectric, for example, may be silicon oxide while the gate electrode may be polysilicon. The gate dielectric, for example, includes a thickness of about a any to hundreds of angstrom (Å), depending on technology node. In one embodiment, the gate electrode may be a gate electrode stack having first and second gate electrode layers. The first gate electrode layer includes a thickness T1 of about 500 Å and the second gate electrode layer includes a thickness T2 of about 1100 Å, such that the gate electrode includes a combined thickness of about 1600 Å. In some embodiments, the gate electrode may be a doped gate electrode. For example, the gate electrode may be polysilicon doped with second polarity type dopants, such as n-type dopants. Other suitable types of gate dielectric and gate electrode as well as thicknesses may also be useful.

The transistor also includes lightly doped diffusion regions 152 disposed in the top Si layer of the substrate adjacent to first and second sides of the gate. The lightly doped regions, in one embodiment, are lightly doped with first polarity type dopants for a first type transistor. For example, the lightly doped regions are lightly doped n-type regions for a n-type transistor and the lightly doped regions are lightly doped p-type regions for a p-type transistor. The lightly doped regions have a dopant concentration of about, for example, 1E13-9E15 atoms/cm$^3$ and a depth of about tens to hundreds Å from the surface of the substrate. Other suitable dopant concentrations and depth dimensions may also be useful.

Sidewall spacers 142 are disposed on sidewalk of the gate. The sidewall spacer, for example, may be a dielectric spacer stack or composite spacer. The composite spacer, for example, may include first and second dielectric spacers. The first and second dielectric spacers, for example, may be silicon nitride/silicon oxide stack. Other suitable types of dielectric materials may also be useful. The sidewall spacers facilitate the formation of heavily doped diffusion regions. Other suitable configurations of spacers may also be useful. For example, the sidewall spacer may be a single spacer.

The transistor also includes heavily doped diffusion regions 154 disposed in the top Si layer of the substrate. The heavily doped regions, for example, serve as the source/drain (S/D) regions of the transistor. The heavily doped regions, for example, are offset from the sidewalls of the gate due to the spacers. In one embodiment, the top Si layer is heavily doped with first polarity type dopants for a first type transistor. The heavily doped diffusion regions include greater dopant concentrations and depth dimensions relative to the lightly doped diffusion regions. The heavily doped diffusion regions have a dopant concentration of about, for example, 1E14-9E15 atoms/cm$^3$ and a depth of about hundreds to thousands Å from the surface of the substrate. Other suitable dopant concentrations and depth dimensions may also be useful.

In one embodiment, the device includes a substrate contact opening 324 in the first region. The substrate contact opening extends through the top Si and insulator layers and exposes a portion of the support substrate. A substrate contact structure 130 is provided in the substrate contact opening. The substrate contact structure, in one embodiment, is a conductive structure. The substrate contact structure includes first portions 114a which are disposed on the top Si layer of the substrate and a second portion 114c which lines the substrate contact opening. The exposed portion of the support substrate, in one embodiment, includes a doped region 122. The doped region 122 serves to lower the contact resistance and form a good contact. The doped region, in one embodiment, is heavily doped with the same polarity type dopants as the support substrate. The doped region, for example, includes B or BF$_2$ dopants with dopant concentration of about 1E14-9E15 atoms/cm$^3$ at and the depth of the doped region, for example, is about hundreds to thousands Å. Other suitable dopants, dopant concentrations and depth dimensions may also be useful. The second portion of the substrate contact structure, as shown, is disposed through the isolation region 108a and contacts the doped region. The substrate contact structure 130, in one embodiment, helps to connect or contact the support substrate to a desired potential. The support substrate, in one embodiment, is connected to a metal or conductive line 182a with desired potential through the substrate contact structure to prevent charging of the support substrate at system level. Preferably, the support substrate is connected to a ground potential to prevent any erratic behavior on RF signals if the support or "handle" substrate (back plate) obtains any charge by any RF or DC coupling.

The substrate contact structure 130, in one embodiment, is formed of a conductive material. The conductive material, in one embodiment, is polysilicon. The conductive material, for example, may be a doped polysilicon. Other suitable types of conductive materials, such as metals, may also be used. In a preferred embodiment, the substrate contact structure has the same material as the gate of the transistor. For example, the first portion of the substrate contact structure may include a gate dielectric 112a with a gate electrode layer thereover while the second portion of the substrate contact structure may include the gate electrode layer. Providing a substrate contact structure which has the same composition as the gate simplifies the process. For example, the gate and substrate contact structure can be formed simultaneously. In other embodiments, the substrate contact structure may have different materials from the gate.

As shown, the gate of the transistor 120 in the second region includes a gate electrode 114b and a gate dielectric layer 112b. As described, the gate electrode 114b includes first and second gate electrode layers with a combined thickness of T1 and T2. As for the substrate contact structure 130 in the first region, it includes first portions which are disposed over the top Si layer and a second portion lining the sidewalk and bottom of the substrate contact opening. The first portions of the substrate contact structure include both the first and second gate electrode layers having a combined thickness of T1 and T2 and the gate dielectric 112a isolating the first portions of the substrate contact structure from the top Si layer while the second portion of the substrate contact structure includes the second gate electrode layer with the thickness T2. As shown, sidewall spacers 142 are also disposed on sidewalk of the first portions of the substrate contact structure.

In one embodiment, a salicide block layer 158 is disposed on the substrate. The salicide block layer 158 prevents formation of silicide contacts on portions of the substrate contact structure. In one embodiment, the salicide block lines the top surface of the second portion of the substrate contact structure and partially overlaps the top surface of the first portions of the substrate contact structure as shown in 1a. In one embodiment, the salicide block slightly overlaps the first portion of the substrate contact structure. The overlap may be, for example, about ≤0.2 μm. Other suitable overlap dimensions may also be useful as long as the non-overlapping portions of the first portions of the substrate contact structure have sufficient area for a contact plug 170a to be disposed thereon. The salicide block layer, for example, is a dielectric layer. For example, the salicide block layer may be undoped silicate glass (USG), oxide, nitride, oxynitride or a combination thereof. Other suitable types of dielectric materials or block materials, such as those compatible for semiconductor processing, may also be useful.

Metal silicide contacts 162 may be disposed on the gate electrode of the gate and S/D regions of the transistor. Metal silicide contacts 162 may also be disposed on the first portions of the substrate contact structure not covered by the salicide block and exposed surface of the top Si layer. The silicide contacts, for example, may be cobalt-based silicide contacts. Other suitable types of metal silicide contacts, such as nickel-based silicide contacts, may also be useful. The silicide contacts may be about several hundred Å thick. Other suitable thickness of silicide contacts may also be useful. The silicide contacts may be employed to reduce contact resistance and facilitate contact to the back-end-of-line (BEOL) metal interconnects.

A dielectric etch stop layer 166 is disposed over the substrate. The etch stop layer, for example, is a dielectric stack having oxynitride (SiON) and silicon nitride. Other suitable types of etch stop layers may also be useful. It is understood that the etch stop layer may also be a single etch stop layer, such as a single silicon nitride layer. The etch stop layer should have a material which can be selectively removed from a dielectric layer 168 thereover. The etch stop layer facilitates in forming contact plugs to contact regions of the substrate contact structure and the transistor, such as the gate electrode and S/D regions. In some embodiments, the etch stop layer may also serve as a stress layer for applying a stress on the channel of the transistor to improve performance.

A dielectric layer 168 is disposed over the substrate. The dielectric layer, for example, is a silicon oxide layer. In one embodiment, the dielectric layer is a high aspect ratio process (HARP) dielectric material. Other suitable types of dielectric materials may also useful. For example, the dielectric layer can be formed from doped silicon oxide such as fluorinated silicon oxide (FSG), undoped or doped silicate glasses such as boron phosphate silicate glass (BPSG) and phosphate silicate glass (PSG), undoped or doped thermally grown silicon oxide, undoped or doped TEOS deposited silicon oxide, and low-k or ultra low-k dielectric materials such as organosilicate glass (OSG) and fluorine-doped silicate glass (FSG). The dielectric layer should be capable of selectively etched or patterned with respect to the etch stop layer.

The dielectric layer 168 serves as an interlevel dielectric (ILD) layer in which contact plugs are disposed. In one embodiment, the ILD layer is a pre-metal dielectric (PMD) layer in which contact plugs are formed to contact the contact regions on the substrate contact structure and the transistor, such as the S/D regions and gate. The contact plugs, for example, includes tungsten (W). Other suitable types of conductive material may also be used to form the contact plugs. As shown in FIG. 1a, first type contact plugs 170a are coupled to contact regions on the substrate contact structure in the first region while second type contact plugs 170b are coupled to the contact regions of the transistor in the second region.

An intermediate dielectric (IMD) layer 180 is formed over the PMD layer. The IMD layer, for example, includes silicon oxide layer. Other suitable types of dielectric materials may also be used to form the IMD layer. Conductive lines or metal lines are disposed in the IMD layer and are in communication with contact plugs in the PMD layer. The conductive lines, for example, may include copper (Cu). Other suitable conductive materials may also be used for the conductive lines.

The contact plugs and conductive lines, in one embodiment, include different conductive materials. For example, the contact plugs include W while the conductive lines include Cu. In other embodiments, the conductive lines and contact plugs include the same material. For example, the contact plugs and conductive lines may include Cu. Other suitable types of conductive materials may also be useful.

As shown, the first type contact plugs 170a are interconnected by first type conductive lines 182a in the IMD layer. The first type conductive lines, in one embodiment, are island structures or individual conductive lines interconnected to ground or any desired potential. As for the second type contact plugs 170b, they are interconnected by second type conductive lines 182b. The second type contact plugs are coupled to respective second type conductive lines in the IMD layer. For example, the contact plug disposed over the source region is coupled to the conductive line which is the source line while the contact plug disposed over the drain region is coupled to conductive line with suitable voltages. The contact plug disposed over the gate of the transistor is coupled to a gate line with suitable gate voltage. Other suitable configurations may also be useful. The first and second type conductive lines 182a and 182b include the same conductive or metal material.

Figure 1B:
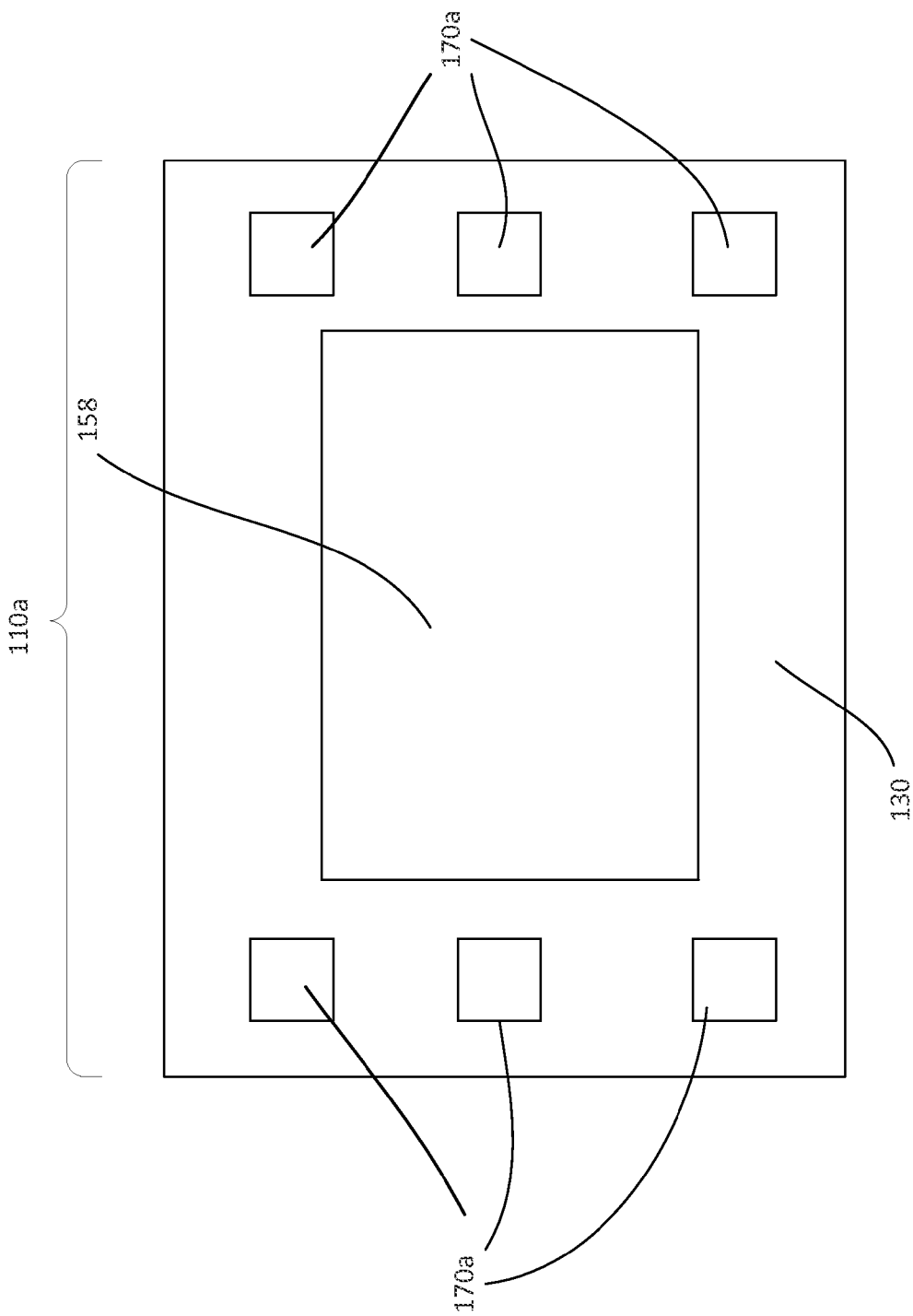

FIG. 1b shows a simplified top view of the first region 110a of the device. For example, FIG. 1b shows the portion of which a substrate contact structure 130 is disposed. As shown, a salicide block 158 is disposed over and covers a portion of the substrate contact structure. For example, the salicide block covers the second portion of the substrate contact structure which penetrates through the isolation region 108a and contacts exposed portion of the support substrate. Referring to FIG. 1b, a plurality of contact plugs 170a are disposed over the first portions of the substrate contact structure which are disposed over the top Si layer. For illustration purpose, six contact plugs are shown to be disposed and coupled to first portions of the substrate contact structure. It is understood that other suitable numbers of contact plugs may be provided.

FIG. 2a shows a cross-sectional view of a portion of another embodiment of a device 200. The device 200, for example, is similar to that described in FIG. 1a. Common elements and features having the same reference numerals may not be described or described in detail. In the interest of brevity, the description of below primarily focuses on the difference(s) between the device of 200 and device of 100.

The device 200 includes a substrate 101 which is the same as that shown in FIG. 1a. The substrate 101 includes a top surface layer 106, a support or "handle" substrate 102 and an insulator layer 104 isolating the top surface layer from the support substrate. The top surface layer, for example, includes single crystalline Si. In this case, the top surface layer may be referred to as the top Si layer. The materials for the substrate 101 are the same as that described in FIG. 1a. The substrate 101 includes first regions 110a and a second region 110b adjacent and in between the first regions. The first region 110a, for example, may be referred to as chip guarding area while the second region 110b, for example, defines a chip region or area of which ICs, such as functional ICs which include transistors, are to be formed. It is understood that the substrate may include other numbers of first and second regions and various types of regions (not shown).

The regions are separated from other regions by isolation regions. The isolation regions are, for example, STI regions. As shown in FIG. 2a, the isolation region 108a in the first region 110a may be wider than the isolation region 108b of the second region 110b, the same as that already described in FIG. 1a. Thus, details related to the substrate and isolation regions will not be described.

The device 200 includes a transistor 220. The transistor 220 is similar to the transistor 110 as described in FIG. 1a. For example, the transistor 220 includes a gate having a gate dielectric layer 112b and a gate electrode 214. The gate electrode 214, for example, is a single gate electrode layer having polysilicon. The thickness of the gate electrode layer, for example, is about 1600 Å. Other suitable gate materials and thickness dimensions may also be useful. The transistor 220 also includes lightly doped diffusion regions 152, sidewall spacers 142 and heavily doped diffusion regions 154. Details of these features will not be described.

In one embodiment, the device 200 includes at least one substrate contact opening 446 which extends from the top surface of the dielectric layer 168 to at least a top surface of the support substrate. As shown in FIG. 2a, the substrate contact opening is formed within the isolation region 108a in the first region 110a. The bottom of the substrate contact opening, for example, may be substantially coplanar with the top surface 102a of the support substrate 102 of the substrate. Alternatively, the bottom of the substrate contact opening may be slightly below the top surface of the support substrate as shown in FIG. 2a.

In one embodiment, the substrate contact opening includes a vertical sidewall profile. The substrate contact opening, for example, may also include angled or tapered sidewalk. As shown, the width of the substrate contact opening, for example, is larger than the width of the contact plugs 170b. The width of the substrate contact opening, for example, is about 2 to 3 times the width of the contact plugs 170b which are coupled to contact regions of the transistor, such as the gate and S/D regions. Other suitable width dimensions may also be useful. In one embodiment, the substrate contact opening is in a ring shape configuration. For example, the substrate contact opening surrounds the second region 110b. In other embodiments, the substrate contact opening may be in the form of a single or individual via or via bar opening. Other suitable shape or configuration for the substrate contact opening may also be useful.

In one embodiment, a substrate contact structure 230 is disposed in the substrate contact opening. The substrate contact structure, in one embodiment, is a conductive ring structure which surrounds the transistor. For example, the ring structure penetrates through the dielectric layer, the isolation region 108a and the insulator layer and contacts the contact region 122 in the support substrate. In the case where the substrate contact structure is in a ring shape configuration, the substrate contact structure may also act as a guard ring. In other embodiments, in the case where the substrate contact opening is in the form of a single or individual via or via bar opening, the substrate contact structure is in a single or individual via bar configuration. Other suitable shape or configuration for the substrate contact structure may also be useful. The substrate contact structure 230, in one embodiment, helps to connect or contact the support substrate to a desired potential. The support substrate, in one embodiment, is connected to a metal or conductive line 282a with desired potential through the substrate contact structure to prevent charging of the support substrate at system level. Preferably, the support substrate is connected to a ground potential to prevent any erratic behavior on RF signals if the support or "handle" substrate (back plate) obtains any charge by any RF or DC coupling.

Referring to FIG. 2a, an intermediate dielectric (IMD) layer 280 is disposed over the PMD layer. Conductive lines are disposed in the IMD layer and are in communication with contact plugs and substrate contact structure in the PMD layer. As shown, the substrate contact structure 230 is interconnected by first type conductive line 282a in the IMD layer. The first type conductive lines, in one embodiment, are in ring shape configuration interconnected to ground or any desired potential. The first type conductive lines, in another embodiment, are island structures or individual conductive lines. The configuration or shape of the first type conductive lines, for example, depends on the shape or configuration of the substrate contact structure. As for the contact plugs 170b, they are interconnected by second type conductive lines 282b. The contact plugs are coupled to respective second conductive lines in the IMD layer. For example, the contact plug disposed over the source region is coupled to the conductive line which is the source line while the contact plug disposed over the drain region is coupled to the conductive line with suitable voltages. The contact plug disposed over the gate of the transistor is coupled to a gate line with suitable gate voltage. Other suitable configurations may also be useful. The first and second type conductive lines 282a and 282b include the same conductive metal material.

The contact plugs and substrate contact structure, in one embodiment, include the same materials. For example, the contact plugs and the substrate contact structures may include W or Cu. In an alternative embodiment, the contact plugs and the substrate contact may be formed with different materials. For example, the contact plugs may include Cu while the substrate contact structures may include W. Other suitable conductive materials may be used for the contact plugs and substrate contact structures.

The device 200 also includes metal silicide contacts 162 disposed on exposed top Si layer and contact regions of the transistor, such as gate and S/D regions. The device also includes a dielectric etch stop layer 166 disposed over the substrate and the transistor. Details of these features will not be described.

FIG. 2b shows a simplified top view of the device 200. For illustration purpose, the substrate contact structure 230 is provided in the form of a ring. For example, the substrate contact structure surrounds the transistor disposed in the second region or chip area 110b. Referring to FIG. 2b, in the case where the substrate contact structure is in the form of a ring, the conductive line 282a which couples to the substrate contact structure is also provided in the form of a ring. As described above, other suitable shape or configuration of the substrate contact structure may also be useful. The configuration or shape of the first type conductive lines, for example, depends on the shape or configuration of the substrate contact structure.

FIGS. 3a-3k show cross-sectional views of an embodiment of a process for forming a device. The process 300, for example, is employed in forming a device, such as that shown in FIG. 1a. Common elements and features having the same reference numerals may not be described or described in detail.

Referring to FIG. 3a, a substrate 101 is provided. The substrate 101, for example, includes a top surface layer 106 separated from a support substrate 102 by an insulator layer 104.

For illustration, the support substrate 102 includes a semiconductor material. The semiconductor material, for example, includes single crystalline Si. Other suitable types of substrate materials or any other suitable semiconductor materials may also be useful. The thickness of the support substrate, for example, is about 775 µm. Other suitable thicknesses may also be useful. The support substrate, for example, may be lightly doped with first polarity type dopants, such as p-type dopants. Providing the support substrate which is lightly doped with second polarity type dopants, such as n-type dopants, may also be useful.

The insulator layer 104, for example, includes a dielectric insulating material. The insulator layer, for example, is formed from silicon oxide, providing a buried oxide (BOX) layer. Other suitable types of dielectric insulating materials may also be useful. Various techniques, such as H implant or thermal oxidation using furnace annealing, may be employed to form the insulator layer. The thickness of the insulator layer, for example, is about 0.1-1 µm. Other suitable thicknesses, materials and techniques for forming the insulator layer may also be useful.

The top surface layer 106, as shown in FIG. 3a, includes a semiconductor material. The semiconductor material, for example, includes single crystalline Si. In this case, the top surface layer may be referred to as the top Si layer and the substrate 101 is a SOI substrate. Other suitable types of substrate materials or any other suitable semiconductor materials may also be useful. In one embodiment, the top surface layer and the support substrate include the same material. Providing different materials for the top surface layer and the support substrate may also be useful. The thickness of the top surface layer, for example, is about 0.05-0.2 µm. Other suitable thicknesses may also be useful.

Referring to FIG. 3a, the substrate 101 includes at least a first region 110a and a second region 110b. The first region, as shown, is adjacent to the second region. The first region 110a, for example, may be referred to as a chip guarding area while the second region 110b, for example, defines a chip region of which ICs, such as functional ICs which include transistors, are to be formed. Although only one first region and one second region are shown, it is understood that the substrate may include other numbers of first and second regions and various types of regions (not shown). For example, the substrate may include other device regions for other types of devices.

The regions are separated from other regions by isolation regions. The substrate is processed to form isolation regions. The isolation regions are, for example, STI regions. Various processes can be employed to form the STI regions. For example, the top Si layer and a portion of the insulator layer of the substrate can be etched using etch and mask techniques to form trenches which are then filled with dielectric materials such as silicon oxide. Chemical mechanical polishing (CMP) can be performed to remove excess oxide and provide a planar substrate top surface. Other processes or materials can also be used to form the STI regions. The STI regions, for example, extend from the top surface of the top Si layer to a portion of the insulator layer. The depth of the STI regions may be, for example, about 0.05-0.2 µm. Other suitable depths for the STI regions may also be useful. In other embodiments, the isolation regions may be other types of isolation regions. As shown, the isolation region 108a in the first region 110a may be wider than the isolation region 108b of the second region 110b. The width of the isolation region 108a, for example, may include any suitable width dimension which is sufficiently wide to accommodate a substrate contact opening as will be described later.

As shown in FIG. 3a, gate layers of a gate are formed on the substrate. In one embodiment, the gate layers include a gate dielectric layer 312 on the substrate and a first gate electrode layer 314a thereon. The gate dielectric layer, for example, is silicon oxide. The thickness of the gate dielectric layer may be about a few to hundreds of Å, depending on technology node. The gate dielectric layer, for example, may be formed by thermal oxidation. For example, the gate dielectric layer is formed by wet oxidation followed by annealing the substrate in an oxidizing ambient. The temperature of the wet oxidation can be, for example, about 800-900° C. The annealing can be, for example, performed at a temperature of about 800-900° C. Other suitable thicknesses, materials and techniques for forming the gate dielectric layer may also be useful.

As for the first gate electrode layer 314a, it is a polysilicon layer. The thickness T1 of the first gate electrode layer may be about 500 Å. Other suitable thickness may also be useful. The gate electrode layer may be formed by, for example, chemical vapor deposition (CVD). Other suitable materials and forming techniques may be used for the first gate electrode layer.

Figure 3B:
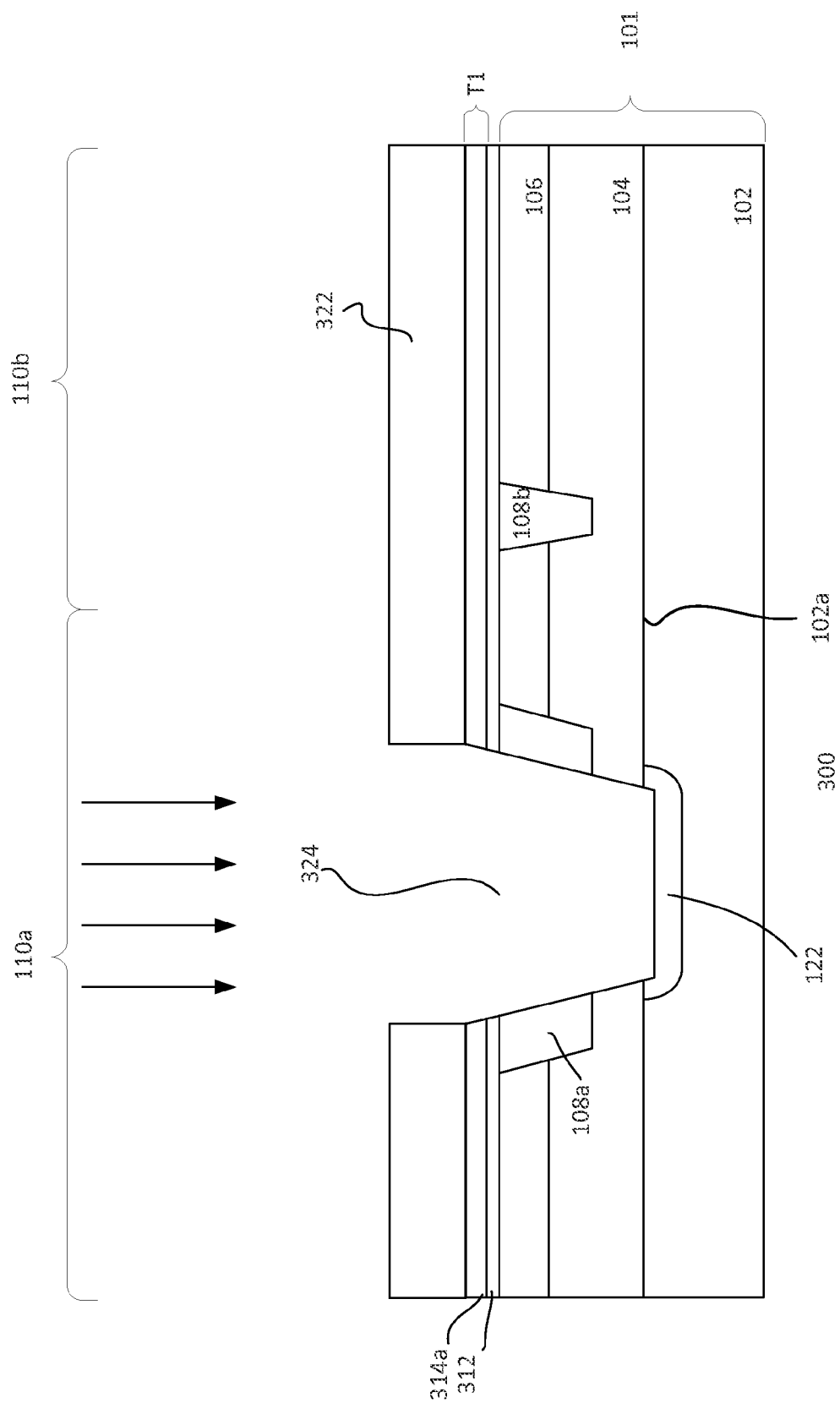

Referring to FIG. 3b, a mask layer 322 is formed on the substrate. The mask layer, tier example, is formed over the first gate electrode layer. In one embodiment, the mask layer is a soft mask layer, such as a photoresist layer. The mask layer may also include other suitable types of mask materials. To improve lithographic resolution, an anti-reflective coating (ARC) may be used below the photoresist layer. An exposure source may selectively expose the photoresist layer through a reticle containing the desired pattern. After selectively exposing the photoresist layer, it is developed to form an opening corresponding to location where the various underlying layers are to be removed to form a substrate contact opening or trench. In one embodiment, the opening of the mask layer is disposed over the isolation region 108a of the first region.

In FIG. 3b, the process continues to form the substrate contact opening 324. To form the substrate contact opening 324, portions in the first region 110a of the substrate exposed by the opening of the mask layer 322 are removed. The exposed portions in the first region, which include portions of the gate dielectric layer, first gate electrode layer, isolation region 108a and insulator layer may be removed by an etch process. The etch process, for example, may include reactive ion etch (RIE). The layers may be removed by employing a multiple-step etching process. Other suitable techniques for removing these layers to form the substrate contact opening may also be useful. The etch process, for example, stops on a top surface 102a of the support substrate 102 of the substrate 101. The etch process, for example, may also slightly consume a portion of the support substrate as shown in FIG. 3b.

In one embodiment, the substrate contact opening 324 includes a non-vertical sidewall profile. The substrate contact opening, for example, includes angled or tapered sidewalls. This can be achieved by tuning the etch chemistry or other suitable techniques. The tapered sidewalk enable better material filling in subsequent processing. In other embodiments, the substrate contact opening may include vertical sidewall profile. As shown, the substrate contact opening is formed within the isolation region 108a in the first region 110a. The bottom of the substrate contact opening, for example, may be substantially coplanar with the top surface 102a of the support substrate 102 of the substrate 101. Alternatively, the bottom of the substrate contact opening may be slightly below the top surface of the support substrate of the substrate as shown in FIG. 3b.

The process continues to form a doped region 122 in the support substrate 102 of the substrate. The doped region, in one embodiment, is a heavily doped region and has the same polarity type dopants as the support substrate. For example, the doped region has first polarity type dopants if the support substrate is lightly doped with first polarity type dopants. The doped region 122 serves to lower the contact resistance and form a good contact. To form the doped region, dopants which are of the same type as the support substrate are implanted into the substrate. The implant may dope into portion of the support substrate which is unprotected by the mask layer. Thus, the mask layer 322 may also serve as an implant mask. The doped region, for example, may include B or $BF_2$ dopants and the depth of the doped region, for example, is about hundreds to thousands Å. The implant dose may be about $1E14-9E15/cm^2$ and the implant energy may be about tens of keV. Other suitable implant parameters may also be useful. The mask layer 322 may be removed after forming the doped region. The mask layer, for example, may be removed by ashing. Other suitable techniques may also be used to remove the mask layer.

Figure 3C:
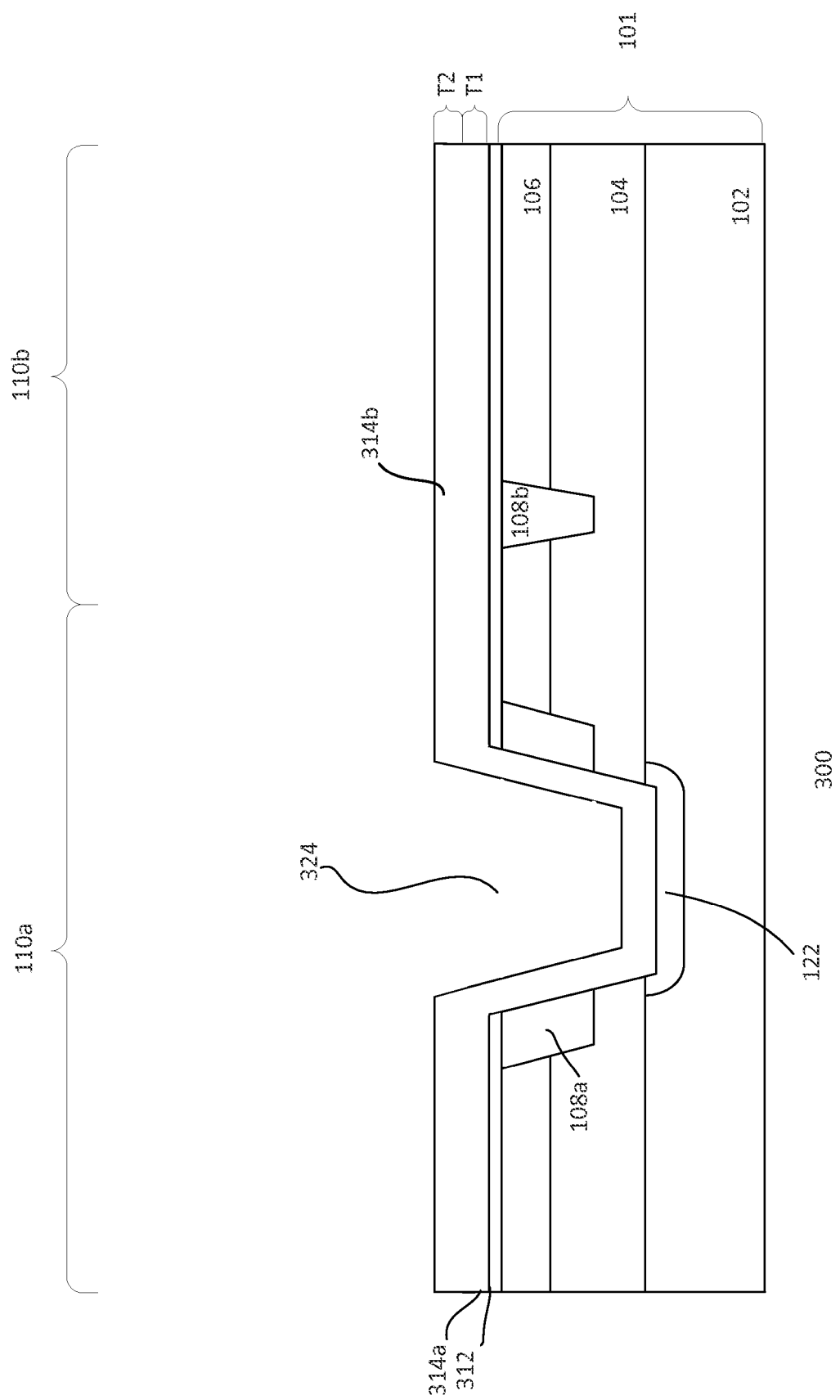

In one embodiment, the process continues by providing a second gate electrode layer 314b over the substrate and lines the sidewalls and bottom of the substrate contact opening 324 as shown in FIG. 3c. The second gate electrode layer, for example, is a polysilicon layer. The thickness T2 of the second gate electrode layer may be about 1100 Å. Other suitable thickness may also be useful. The second gate electrode layer may be formed by, for example, CVD. Other suitable techniques for forming the second gate electrode layer may also be useful. The first and second gate electrode layers, for example, may be doped at this stage. The first and second gate electrode layers, for example, may be doped with second type dopants, such as n-type dopants.

Figure 3D:
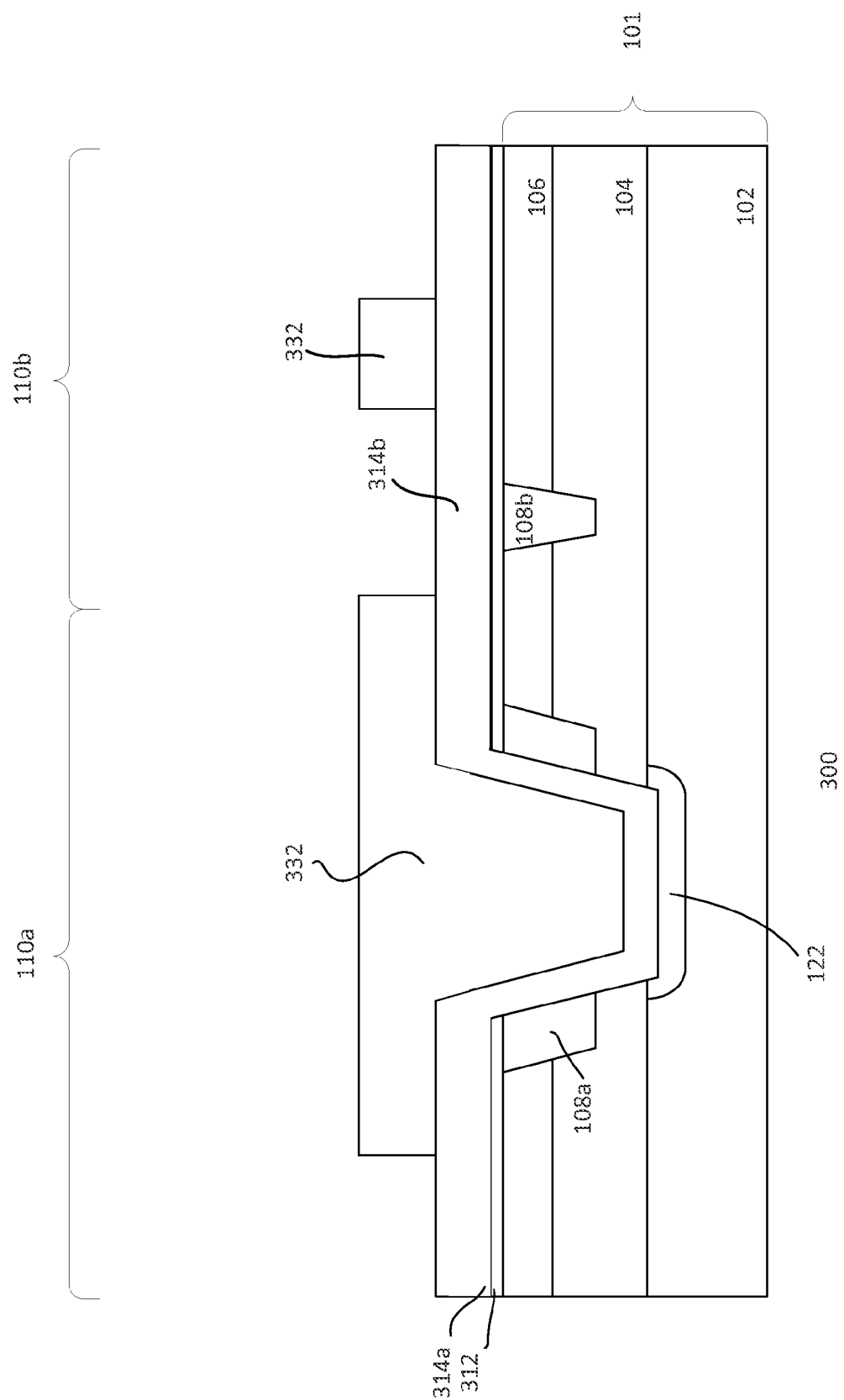

Referring to FIG. 3d, the process continues to pattern the gate dielectric and gate electrode layers. In one embodiment, a mask layer 332 is formed on the substrate and fills the substrate contact opening. The mask layer, for example, is formed over the second gate electrode layer. In one embodiment, the mask layer 332 is a soft mask layer, such as a photoresist layer. To improve lithographic resolution, an ARC may be used below the photoresist layer. An exposure source may selectively expose the photoresist layer through a reticle containing the desired pattern. After selectively exposing the photoresist layer, it is developed to form openings corresponding to locations where the various underlying layers are to be removed.

The patterned mask layer 332 serves as an etch mask for an etch process, as shown in FIG. 3d. For example, the etch transfers the pattern of the mask to the underlying layers. The etch removes the gate dielectric and gate electrode layers unprotected by the mask, exposing portions of the top Si layer of the substrate. The etch, for example, may be an anisotropic etch, such as RIE. Other suitable types of etch processes may also be useful. In one embodiment, RIE is employed to pattern the gate dielectric and gate electrode layers to form a gate of a transistor 120 in the second region 110b. In one embodiment, the etch patterns the gate dielectric and gate electrode layers to form the gate of the transistor 120 in the second region 110b and a substrate contact structure 130 in the first region 110a simultaneously as shown in FIG. 3e.

As described, the gate and substrate contact structure are formed in the same etch process using the various gate layers. Providing the substrate contact structure which has the same composition as the gate simplifies the process. Alternatively, the gate and substrate contact structure may be formed using different processes. This allows the gate and substrate contact structure to have different materials. For example, after the gate of a transistor is formed, a conductive layer is formed on the substrate and lines the substrate contact opening and is patterned to form the substrate contact structure. Other suitable techniques for forming the gate and substrate contact structure may also be useful.

As shown, the gate of the transistor 120 in the second region includes a gate electrode 114b and a gate dielectric layer 112b. The gate electrode 114b includes the first and second gate electrode layers with a combined thickness of T1 and T2. As for the substrate contact structure 130 in the first region, it includes first portions 114a which are disposed over the top Si layer and a second portion 114c lining the sidewalls and bottom of the substrate contact opening and contacts the doped region 122. The first portions of the substrate contact structure include both the first and second gate electrode layers having a combined thickness of T1 and T2 and the dielectric 112a isolating the first portions of the substrate contact structure from the top Si layer while the second portion of the substrate contact structure includes the second gate electrode layer with the thickness T2.

In one embodiment, lightly doped diffusion regions 152 are formed in the top Si layer adjacent to sidewalk of the gate in the second region. The lightly doped diffusion regions have first polarity type dopants for a first type transistor. To form the lightly doped diffusion regions, first polarity type dopants are implanted into the substrate using an implant mask (not shown). The depth of the lightly doped diffusion regions, for example, is about tens to hundreds Å. The implant dose may be about $1E13-9E15/cm^2$ and the implant energy may be about several to tens of keV. Other suitable implant parameters may also be useful.

Figure 3F:
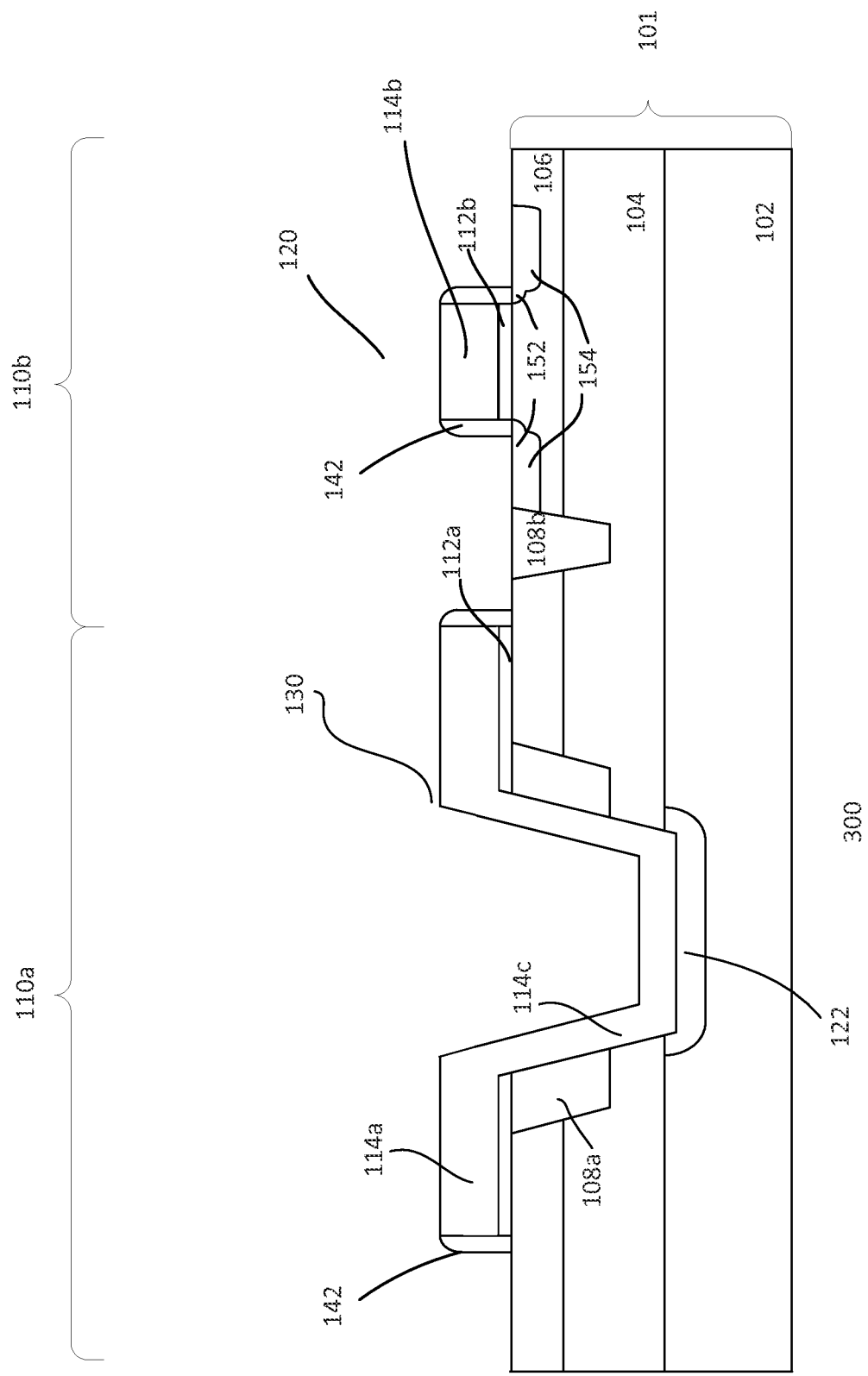

The process continues to form sidewall spacers 142. To form the sidewall spacers, a dielectric spacer layer 342 is deposited on the substrate as shown in FIG. 3e. The dielectric spacer layer, in one embodiment, is a composite or dielectric spacer stack. The composite stack, for example, may include first and second dielectric spacer layers. The first and second dielectric spacer layers, for example, may be silicon oxide and silicon nitride. Other suitable types of dielectric materials may also be used. The dielectric spacer layer may be formed by CVD. The dielectric spacer layer may also be formed using other suitable techniques. The thickness of the dielectric spacer layer may be about, for example, hundreds of Å. Other suitable thickness for the dielectric spacer layer may also be useful. The thickness, for example, may depend on the desired width of the spacers. An anisotropic etch, such as RIE, may be performed to remove horizontal portions of the dielectric spacer layer, leaving spacers 142 on the sidewalls of the gate and sidewalls of the first portions of the substrate contact structure as shown in FIG. 3f. In other embodiments, the dielectric spacer layer may be a single dielectric spacer layer.

Referring to FIG. 3f, heavily doped diffusion regions 154 are finned in the top Si layer adjacent to sidewalls of the gate in the second region. The heavily doped regions, for example, serve as the S/D regions of the transistor. The heavily doped regions, for example, have first polarity type dopants for a first polarity type transistor. Forming the heavily doped regions include implanting first polarity type dopants into the top Si layer of the substrate. For example, the implant may be introduced into the substrate using an implant mask. In this case, the sidewall spacers cause the heavily doped diffusion regions to be offset from sidewalls of the gate. The heavily doped diffusion regions include greater dopant concentrations and depth dimensions relative to the lightly doped diffusion regions. The depth of the heavily doped diffusion regions, for example, is about hundreds to thousands Å. The implant dose may be about $1E14$-$9E15/cm^2$ and the implant energy may be several to tens of keV. Other suitable implant parameters may also be used to form the heavily doped diffusion regions. This forms a transistor 120. Although only one transistor is shown, it is understood that there could be more than one transistors formed on the same substrate.

Figure 3G:
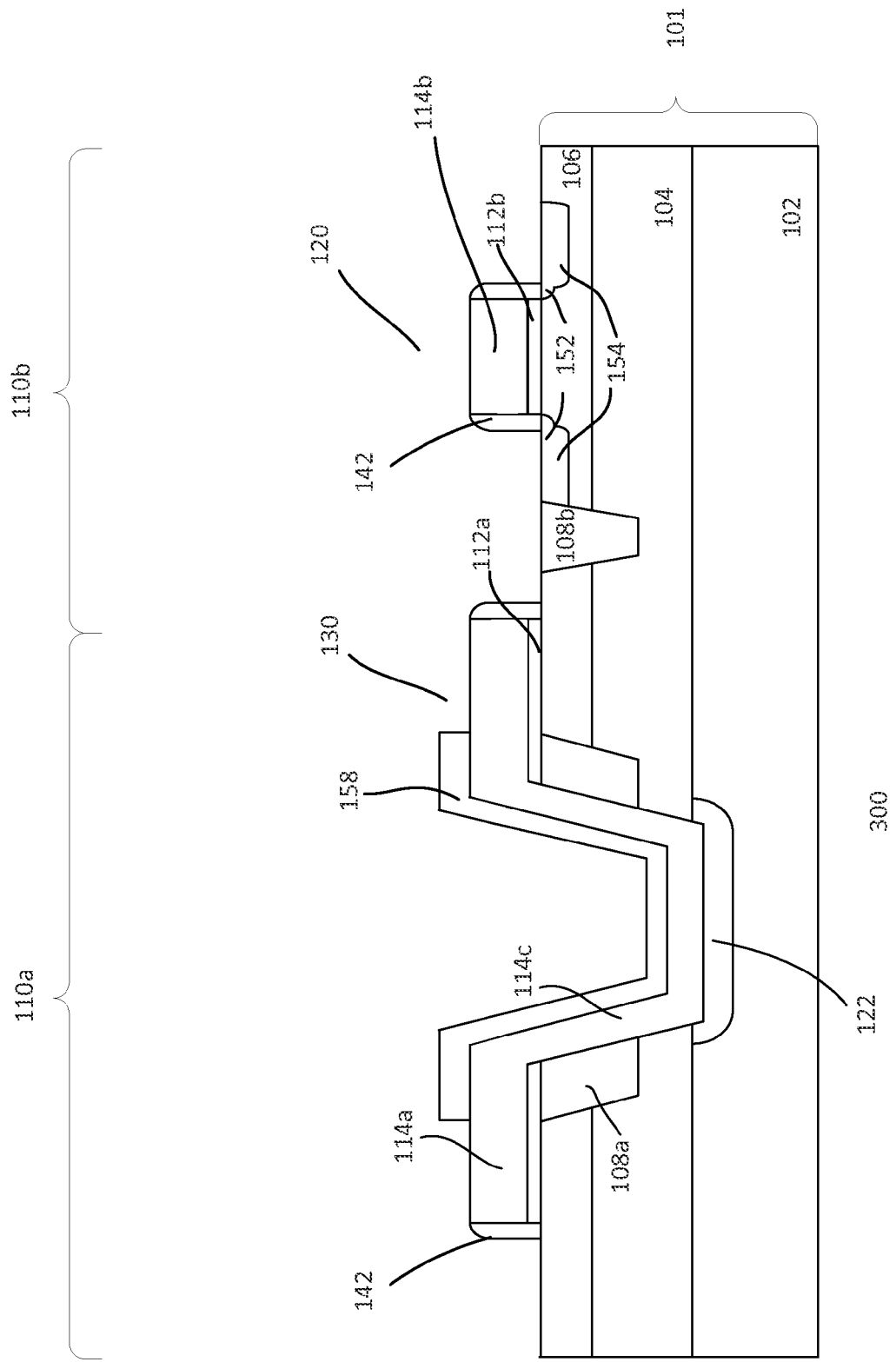

In one embodiment, a salicide block layer is formed on the substrate. The salicide block layer is formed on the substrate using, for example, CVD process. The salicide block layer is patterned using suitable etch and mask technique. The patterned salicide block layer 158 prevents formation of silicide contacts on portions of the substrate contact structure. In one embodiment, the salicide block lines the top surface of the second portion of the substrate contact structure and partially overlaps the top surface of the first portions of the substrate contact structure as shown in FIG. 3g. In one embodiment, the salicide block slightly overlaps the first portions of the substrate contact structure. The overlap may be, for example, about ≥0.2 μm. Other suitable overlap dimensions may also be useful as long as the non-overlapping portions of the first portions of the substrate contact structure have sufficient area for a contact plug 170a to be formed thereon. The salicide block layer, for example, is a dielectric layer. For example, the salicide block layer may be USG, oxide, nitride, oxynitride or a combination thereof. Other suitable types of dielectric materials or block materials, such as those compatible for semiconductor processing, may also be useful.

Figure 3H:
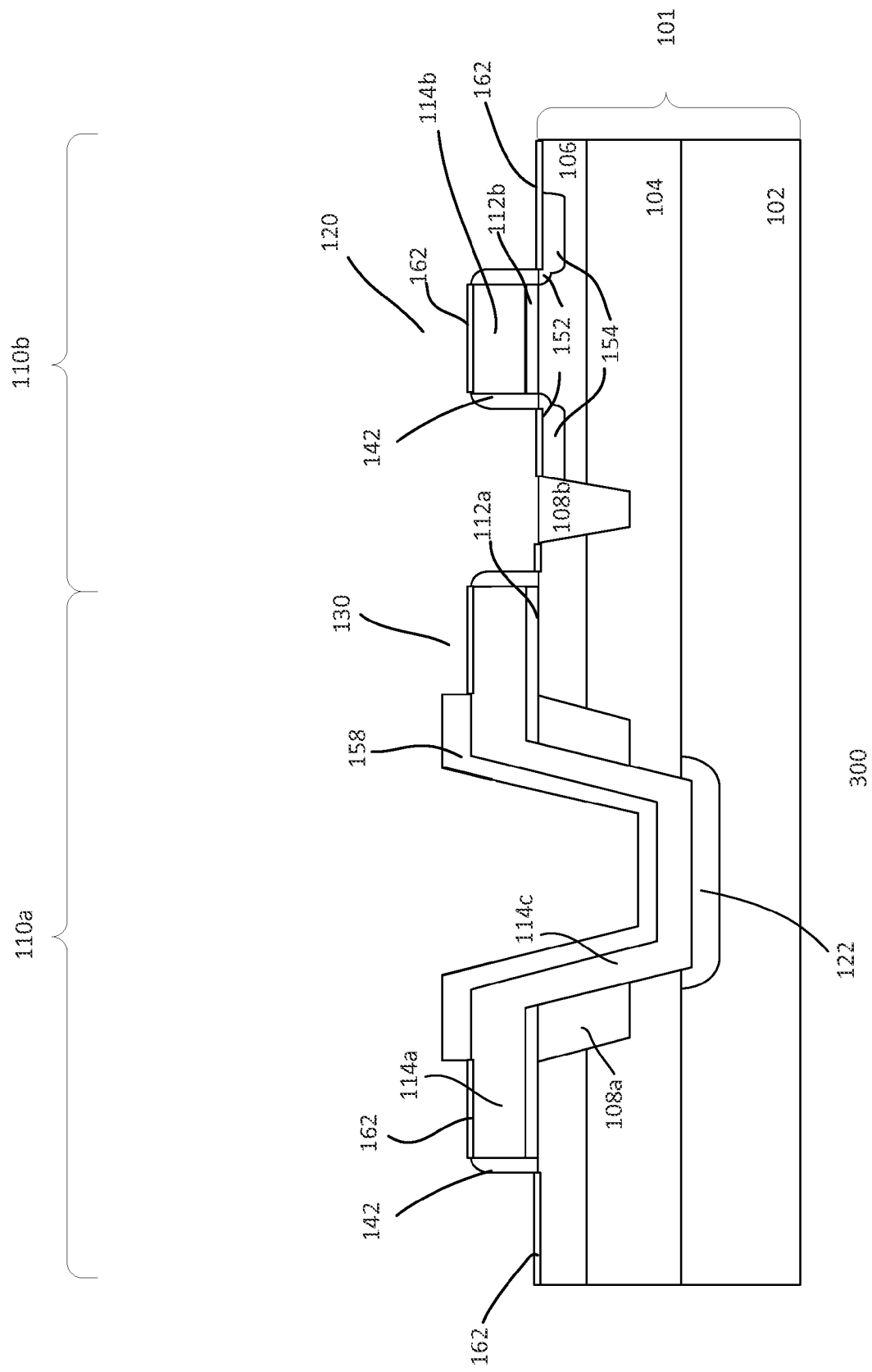

After forming the salicide block layer, a metal silicide process is performed. The metal silicide process, for example, is a cobalt silicide process. Other suitable types of silicide processes may also be performed. The silicide process forms metal silicide contacts 162 in exposed portions of silicon surface, including top Si layer and gates. For example, metal silicides contacts, such as but not limited to cobalt silicide contacts, are formed on the various connections to the transistor and the substrate contact structure. For example, metal silicide contacts may be formed on the S/D regions and gate of the transistor in the second region and metal silicide contacts may be formed on exposed first portions of the substrate contact structure in the first region as shown in FIG. 3h. Metal silicide contacts are also formed for connections of transistors of the other device regions. The silicide contacts are to facilitate low resistance contacts between the active substrate and the BEOL metal lines. In one embodiment, the metal silicide contact is about several hundred Å thick. Providing other suitable thicknesses may also be useful.

To form the silicide contacts, a metal layer is deposited on the surface of the top Si surface layer of the substrate. The metal layer example, may be cobalt or an alloy thereof. Other suitable types of metallic layers, such as nickel, or alloys thereof, may also be used. The metal layer can be formed by physical vapor deposition (PVD). Other suitable types of metal elements and/or be formed by other types of techniques may also be useful.

A first anneal may be performed. The first anneal diffuses the metal dopants into the active substrate, forming a silicided layer. The first anneal, for example, is performed at a temperature of about 300-600° C. for about 10-60 seconds. Excess metal not used in the silicidation of the active surface is removed by, for example, a wet removal process. For example, unreacted metal material is removed selective to the silicide contacts. A second anneal may be performed to enhance the material properties of the silicified layer, for example, lower resistivity. The first and second annealing processes may be a rapid thermal anneal (RTA). Other annealing parameters or techniques may also be useful to form the silicide contacts.

Referring to FIG. 3i, a dielectric etch stop layer 166 is formed on the substrate, covering the transistor and the substrate contact structure. The etch stop layer, for example, may include a dielectric stack. The dielectric stack, for example, may include SiON and silicon nitride. Other suitable types of etch stop layers may also be useful. It is understood that the etch stop layer may also include a single etch stop layer, such as a single silicon nitride layer. The etch stop layer should have a material which can be selectively removed from a dielectric layer formed thereover. The etch stop layer facilitates in forming via or contact plugs to contact regions of the transistor, such as the gate electrode and S/D regions, and contact regions on the first portions of the substrate contact structure. In some embodiments, the etch stop layer may also serve as a stress layer for applying a stress on the channel of the transistor to improve performance. Various techniques, such as CVD, may be employed to form the etch stop layer.

Figure 3J:
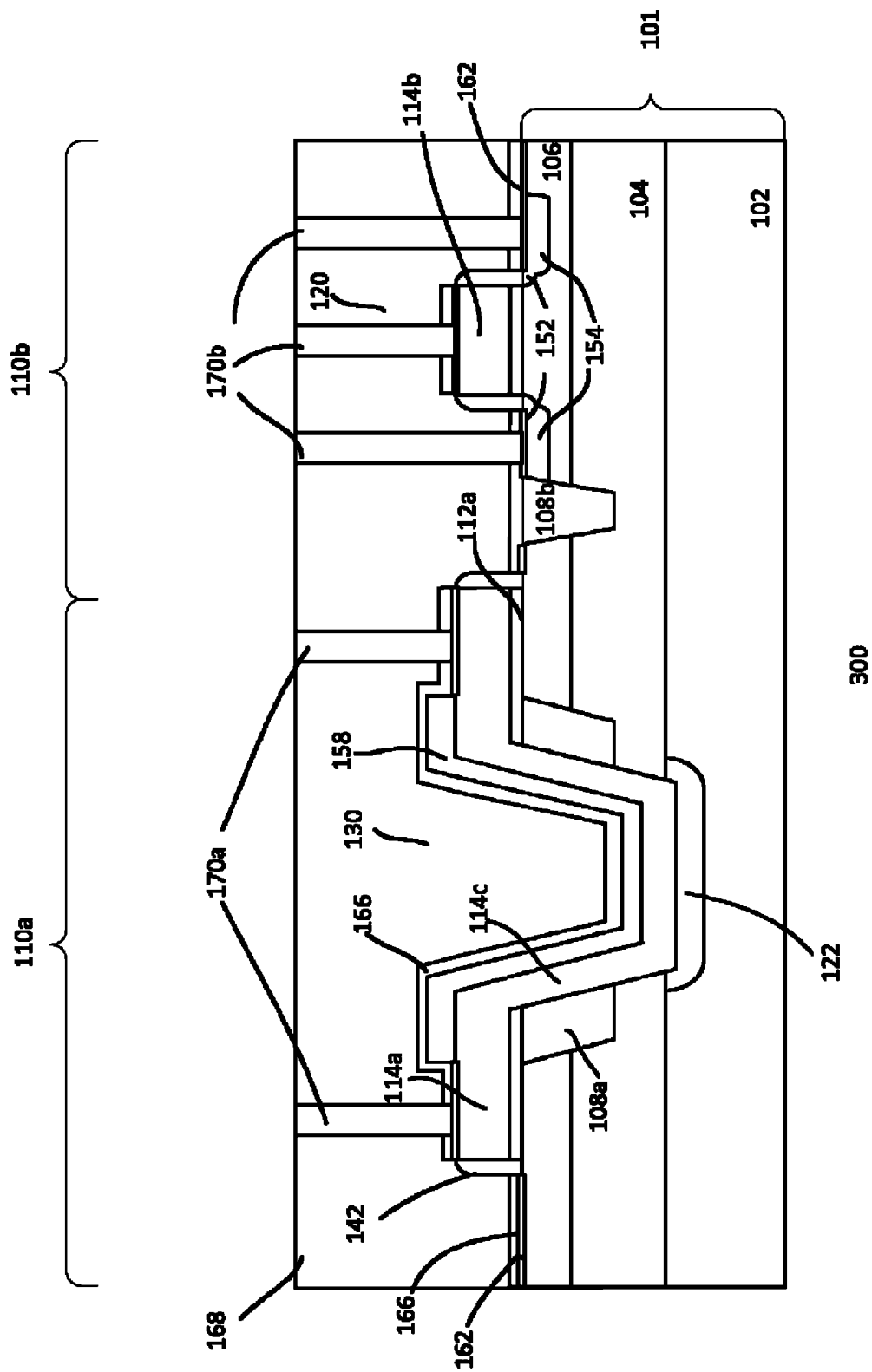

The process continues to form a dielectric layer 168 on the substrate as shown in FIG. 3j. The dielectric layer serves as an interconnect dielectric layer in which interconnects are formed to couple to the various contact regions of the transistor and on top of first portions of the substrate contact structure. The dielectric layer, for example, is a silicon oxide layer. In one embodiment, the dielectric layer is a HARP dielectric material. Other suitable types of dielectric materials are also useful. For example, the dielectric layer can be formed from doped silicon oxide such as FSG, undoped or doped silicate glasses such as BPSG and PSG, undoped or doped thermally grown silicon oxide, undoped or doped TEOS deposited silicon oxide, and low-k or ultra low-k dielectric materials such as OSG. The dielectric layer should be capable of selectively etched or patterned with respect to the etch stop layer.

In one embodiment, the ILD layer is a PMD layer in which contact plugs are formed to the contact regions. To form the contact plugs, via openings are formed in the PMD layer using, for example, mask and etch processes, such as RIE. The via openings are filled with a conductive material. The conductive material, for example, includes tungsten (W). Other suitable types of conductive material may also be used to form the contact plugs. Excess conductive material is removed by, for example, CMP to form a planar top surface with exposed contact plugs in the via openings. First type contact plugs 170a are coupled to contact regions on the substrate contact structure in the first region while second type contact plugs are coupled to the contact regions of the transistor in the second region as shown in FIG. 3j.

Figure 3K:
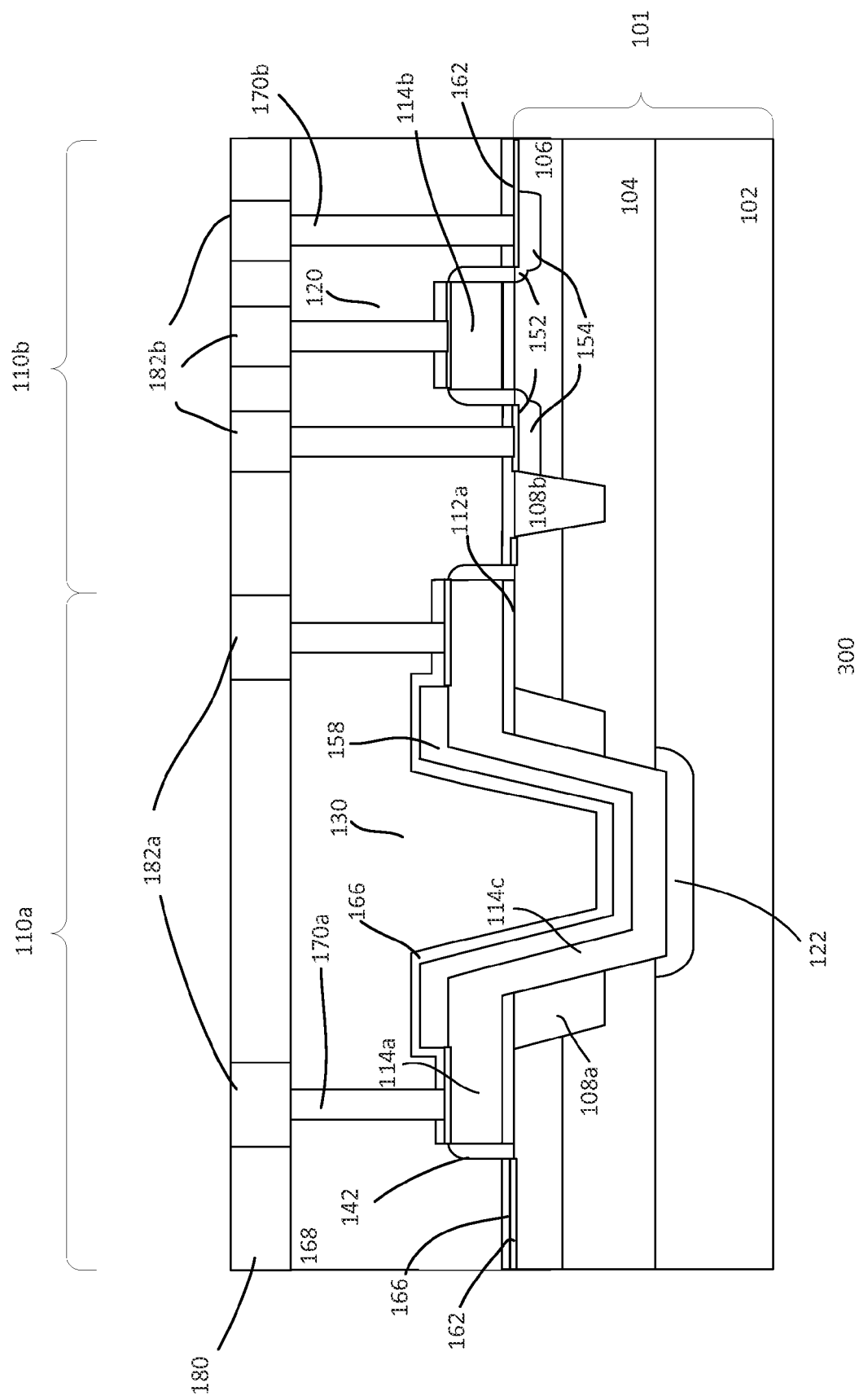

Referring to FIG. 3k, an intermediate dielectric (IMD) layer 180 is formed over the PMD layer. The IMD layer, for example, includes silicon oxide layer. Other suitable types of dielectric materials may also be used to form the IMD layer. The IMD layer, for example, is formed by CVD. Other suitable forming techniques may also be useful. Trenches are formed in the IMD layer using mask and etch processes. The trenches correspond to conductive lines and are in communication with contact plugs in the PMD layer. The trenches are filled with a conductive material. The conductive materials for the conductive lines, for example, may include copper (Cu). Excess conductive materials are removed by, for example, CMP to provide a planar top surface with exposed conductive lines. Other suitable techniques for forming the conductive lines as well as the use of other suitable types of conductive materials may also be useful. For example, reactive ion etch (RIE) techniques may also be used or a combination of RIE and damascene techniques may also be useful.

As described, the contact plugs and conductive lines are formed using separate processes. For the case where the contact plugs and conductive lines are formed using separate processes, the conductive material of the contact plugs and conductive lines may be different.

As shown, the first type contact plugs 170a are interconnected by first type conductive lines 182a in the IMD layer. The first type conductive lines, in one embodiment, are island structures or individual conductive lines interconnected to ground or any desired potential. As for the second type contact plugs 170b, they are interconnected by second type conductive lines 182b. The second type contact plugs are coupled to respective second conductive lines in the IMD layer. For example, the contact plug disposed over the source region is coupled to the conductive line which is the source line while the contact plug disposed over the drain region is coupled to conductive line with suitable voltages. The contact plug disposed over the gate of the transistor is coupled to a gate line with suitable gate voltage. Other suitable configurations may also be useful. The first and second type conductive lines 182a and 182b include the same conductive or metal material.

FIG. 4a-4g show cross-sectional views of another embodiment of a process for forming a device. The process 400, for example, is employed in forming a device, such as that shown in FIG. 2a. The process 400 is similar to that described in FIGS. 3a-3k. Common elements may not be described or described in detail. In the interest of brevity, the description of below primarily focuses on the difference(s) between the process 400 and process 300.

Figure 4A:
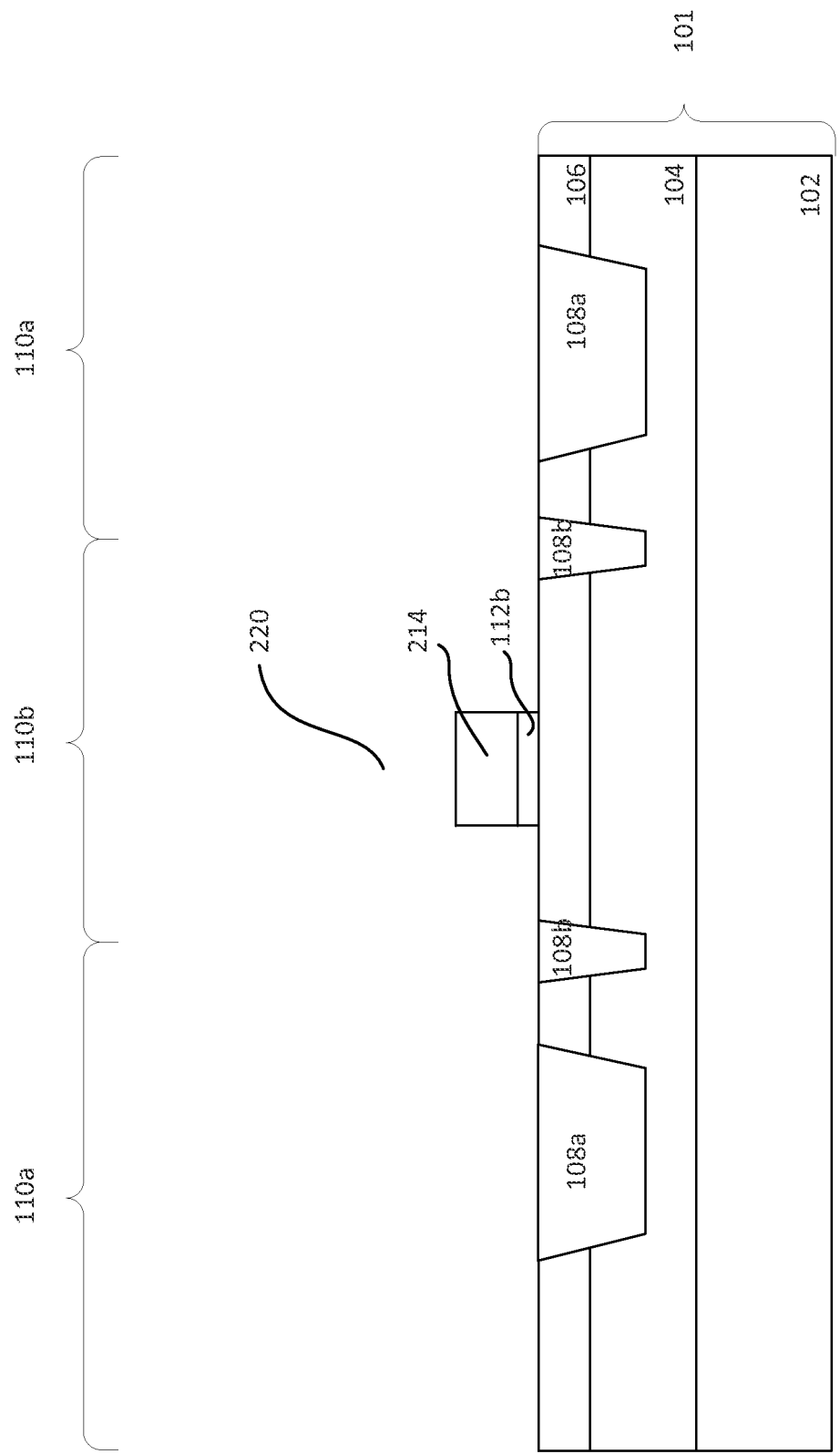

Referring to FIG. 4a, a partially processed substrate is provided. The partially process substrate is similar to that shown in FIG. 3a. For example, a substrate 101 which is the same as that shown in FIG. 3a is provided. The substrate 101 includes a top surface layer 106, a support substrate 102 and an insulator layer 104 isolating the top surface layer from the support substrate. The top surface layer, for example, includes a single crystalline Si. In this case, the top surface layer may be referred to as the top Si layer. This, for example, forms a SOI substrate. The substrate 101 includes first regions 110a and a second region 110b adjacent and in between the first regions. The first region 110a, for example, may be referred to as chip guarding area while the second region 110b, for example, defines a chip region or area of which ICs, such as functional ICs which include transistors, are to be formed. It is understood that the substrate may include other numbers of first and second regions and various types of regions (not shown).

The regions are separated from other regions by isolation regions. The isolation regions are, for example, STI regions. As shown in FIG. 4a, the isolation region 108a in the first region 110a may be wider than the isolation region 108b of the second region 110b, the same as that already described in FIG. 3a. Thus, details related to the substrate and isolation regions will not be described.

The process continues to form gate layers. Gate layers of a gate of a transistor 220 are formed on the substrate. In one embodiment, the gate layers include a gate dielectric layer on the substrate and a gate electrode layer formed thereon. The gate dielectric layer is the same as that described in FIG. 3a. As for the gate electrode layer, it is a single gate electrode layer which includes a polysilicon layer. The thickness of the gate electrode layer may be, for example, about 1600 Å. Other suitable thickness may also be useful. Various suitable techniques for forming the gate dielectric and gate electrode layer may be used, the same as that described in FIG. 3a.

A mask layer (not shown) is formed on the substrate. The mask layer, for example, is formed over the gate electrode layer. In one embodiment, the mask layer is a soft mask layer, such as a photoresist layer. Other suitable types of mask layer may also be useful. An exposure source may selectively expose the photoresist layer through a reticle containing the desired pattern. After selectively exposing the photoresist layer, it is developed to form openings corresponding to locations when the gate layers are to be removed. To improve lithographic resolution, an ARC may be used below the photoresist layer.

The patterned mask layer serves as an etch mask for a subsequent etch process, as shown in FIG. 4a. For example, the etch transfers the pattern of the mask to the gate layers. The etch removes the gate layers unprotected by the mask, exposing the top Si layer of the substrate. The etch, for example, may be an anisotropic etch, such as RIE. Other suitable types of etch processes may also be useful. In one embodiment, RIE is employed to pattern the gate layers to form a gate having a gate dielectric 112b and gate electrode 214 of a transistor 220 in the second region 102b.

Figure 4B:
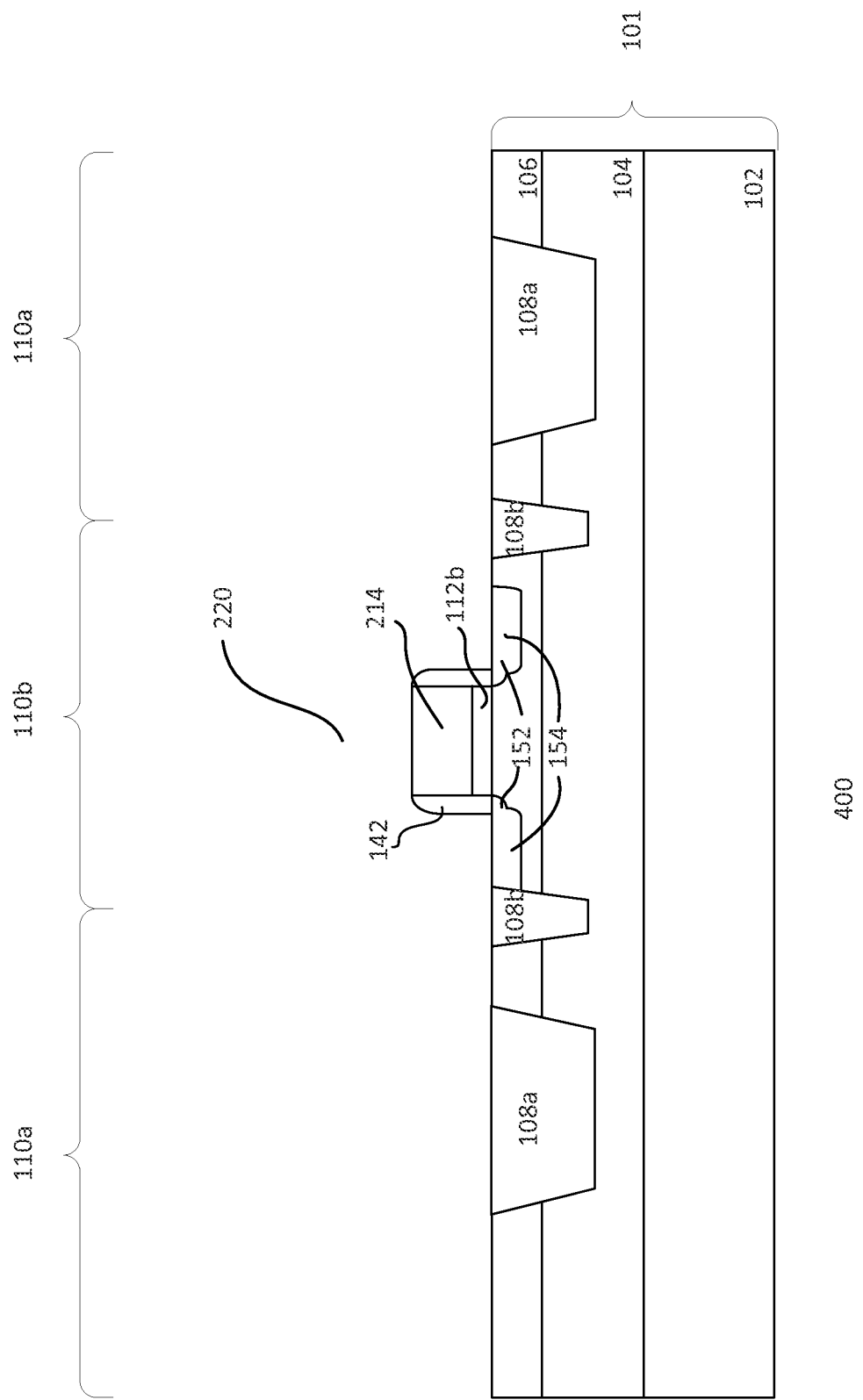

Referring to FIG. 4b, the process continues to form lightly doped diffusion regions 152 adjacent to sidewalk of the gate and to form sidewall spacers 142 on sidewalk of the gate. The process further forms heavily doped diffusion regions 154, such as S/D regions, in the top Si layer of the substrate. The sidewall spacers cause the S/D regions to be offset from sidewalk of the gate as shown in FIG. 4b. The materials, techniques and process parameters used for forming the lightly doped diffusion regions, sidewall spacers and heavily doped diffusion regions are the same as that described in FIGS. 3e-3f. This forms a transistor 220 as shown in FIG. 4b. Although only one transistor is formed, it is understood that other numbers of transistors can be formed on the same substrate.

Figure 4C:
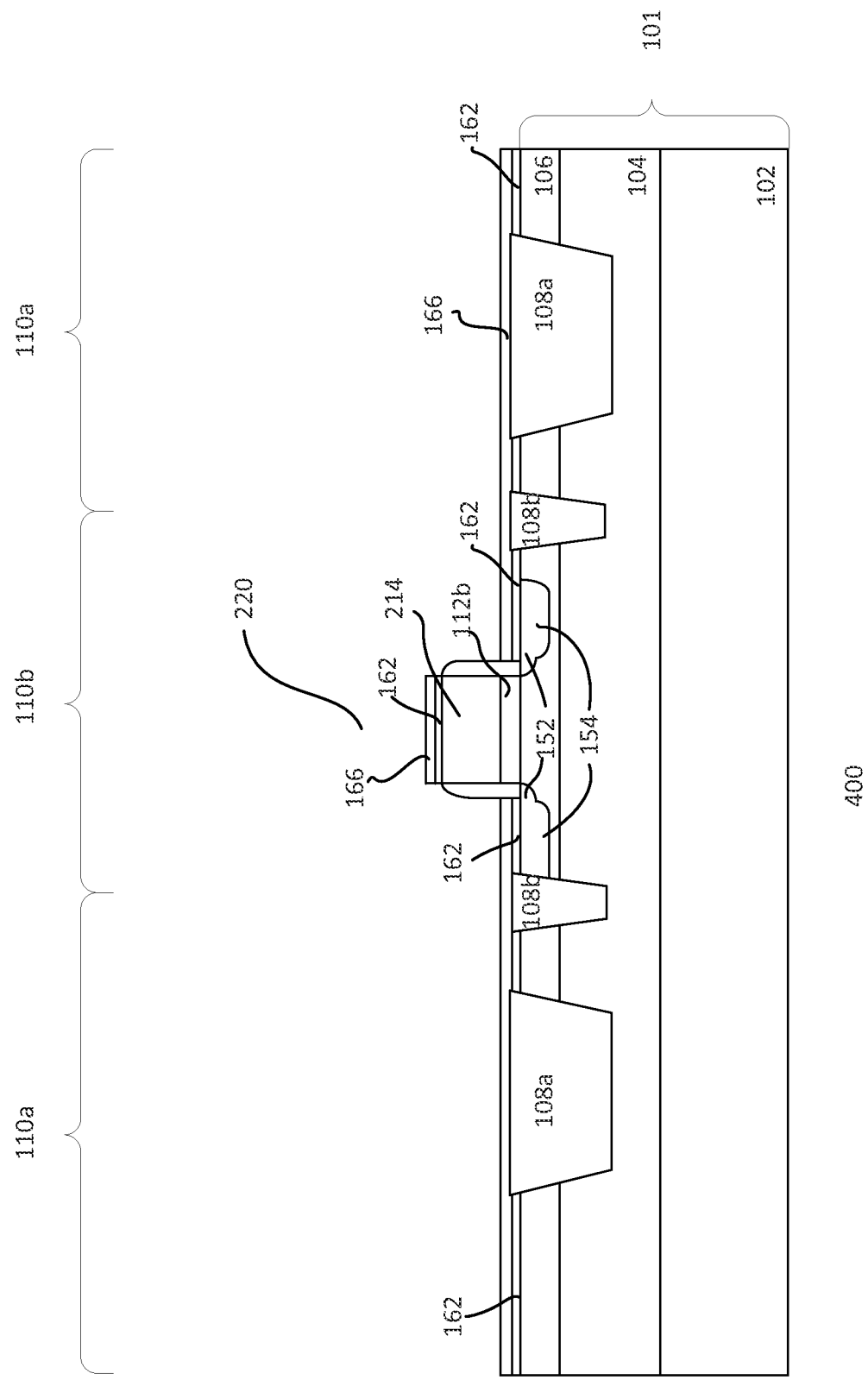

In FIG. 4c, a metal silicide process is performed. The silicide process forms metal silicide contacts 162 in exposed portions of silicon surface, including top Si layer and gates. A dielectric etch stop layer 166 is formed on the substrate, covering the transistor and the metal silicide contacts as well as the isolation regions as shown in FIG. 4c. The materials, techniques and process parameters employed for forming the metal silicide contacts and dielectric etch stop layer are the same as that described in FIGS. 3h-3i.

Figure 4D:
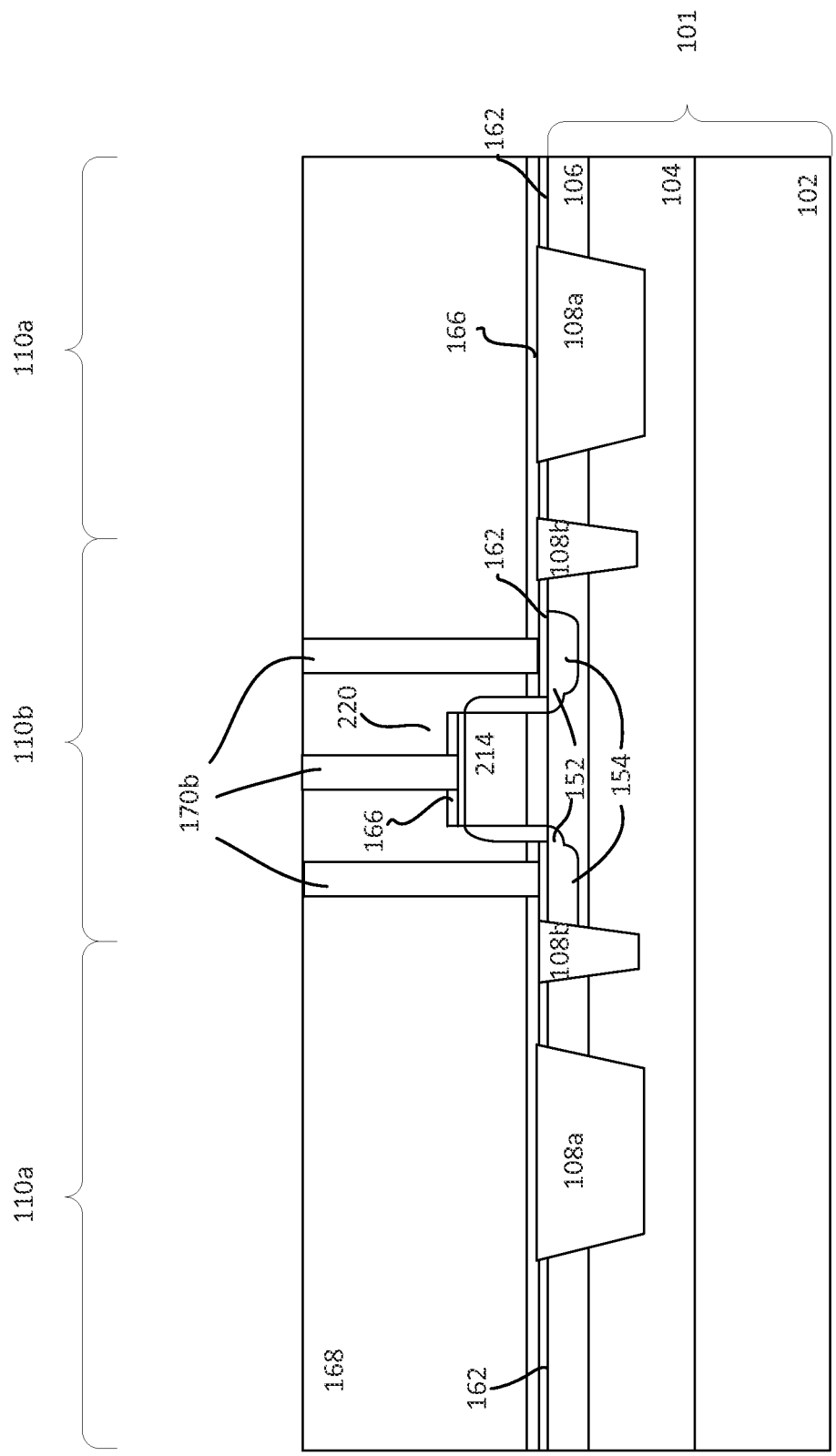

The process continues to form a dielectric layer 168 on the substrate as shown in FIG. 4d. In one embodiment, the dielectric layer serves as an interconnect dielectric layer in which interconnects are formed to couple to the various contact regions of the transistor. In one embodiment, the ILD layer is a PMD layer in which contact plugs are formed to the contact regions. Via openings are formed in the PMD layer using, for example, mask and etch processes, such as RIE. The via openings are filled with a conductive material. The materials, techniques and process parameters employed for forming the dielectric layer and contact plugs are the same as that described in FIG. 3j. In one embodiment, the contact plugs 170b are coupled to the contact regions of the transistor in the second region as shown in FIG. 4d. As shown, no contact plugs are formed in the first regions 110a.

In one embodiment, the process continues to form at least one substrate contact structure. To form the substrate contact structure, a mask layer 442 is formed over the dielectric layer 168. In one embodiment, the mask layer is a soft mask layer, such as a photoresist layer. Other suitable types of mask layer may also be useful. To improve lithographic resolution, an ARC may be used below the photoresist layer. An exposure source may selectively expose the photoresist layer through a reticle containing the desired pattern. After selectively exposing the photoresist layer, it is developed to form an opening corresponding to location where the various underlying layers are to be removed to form substrate contact opening or trench. In one embodiment, the opening of the mask layer is disposed over the isolation regions 108a of the first regions.

In FIG. 4e, the process continues to form the substrate contact opening 446. To form the substrate contact opening 446, portions in the first regions 110a of the substrate exposed by the opening of the mask layer 442 are removed. The exposed portions in the first regions of the substrate, which includes portions of the dielectric layer, dielectric etch stop layer, isolation regions 108a and insulator layer may be removed by an etch process. The etch process, for example, may include RIE. The layers may be removed by employing a multiple-step etching process. Other suitable techniques for removing these layers to form the substrate contact opening may also be useful. The etch process, for example, stops on a top surface 102a of the support substrate of the substrate. As shown, the substrate contact opening extends from the top surface of the dielectric layer to the bottom of the insulator layer of the substrate. The etch process, for example, may also slightly consume a portion of the support substrate of the substrate as shown in FIG. 4e.

In one embodiment, the substrate contact opening 446 includes a vertical sidewall profile. The substrate contact opening 446, for example, may also include angled or tapered sidewalk. As shown, the substrate contact opening is formed within the isolation regions 108a in the first regions of the substrate. The bottom of the substrate contact opening, for example, may be substantially coplanar with the top surface 102a of the support substrate 102 of the substrate. Alternatively, the bottom of the substrate contact opening may be slightly below the top surface of the support substrate of the substrate as shown in FIG. 4e. In one embodiment, the substrate contact opening is in a ring shape configuration. For example, the substrate contact opening 446 surrounds the second region of the substrate. In other embodiments, the substrate contact opening may be in the form of a single or individual via or via bar opening. Other suitable shape or configuration for the substrate contact opening may also be useful.

The process continues to form doped regions 122 in the support substrate 102 of the substrate. The doped regions, in one embodiment, are heavily doped regions having the same polarity type dopants as the support substrate. The doped region 122 serves to lower the contact resistance and form a good contact. To form the doped region, dopants which are of the same type as the support substrate are implanted into the substrate. The implant may dope into portion of the support substrate which is unprotected by the mask layer. Thus, the mask layer 442 may also serve as an implant mask. The doped region, for example, may include B or $BF_2$ dopants and the depth of the doped region, for example, is about hundreds to thousands Å. The implant dose may be about 1E14-9E15/cm$^2$ and the implant energy may be about tens of keV. Other suitable implant parameters may also be useful. The mask layer 442 may be removed after forming the doped regions. The mask layer, for example, may be removed by ashing. Other suitable techniques may also be used to remove the mask layer.

Figure 4F:
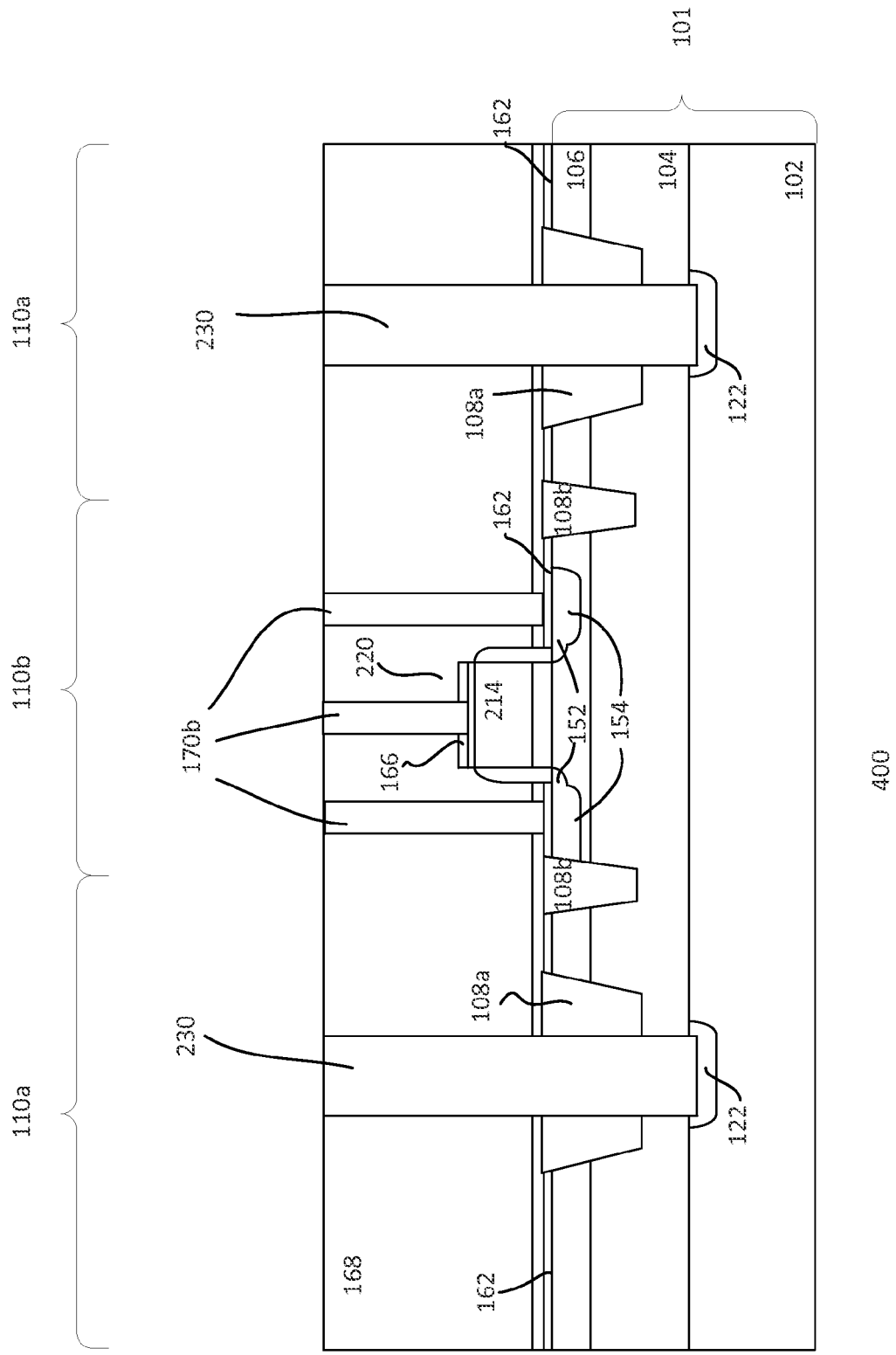

The process continues to complete the formation of the substrate contact structure 230. In one embodiment, a conductive material, such as tungsten (W), fills the substrate contact opening. For example, the substrate contact opening is filled by CVD. Other suitable techniques for filling the opening may also be useful. A planarizing process, such as CMP, is performed to remove excess fill material and to provide a co-planar top surface with the dielectric layer and top surface of the contact plugs in the second region as shown in FIG. 4f.

Figure 4G:
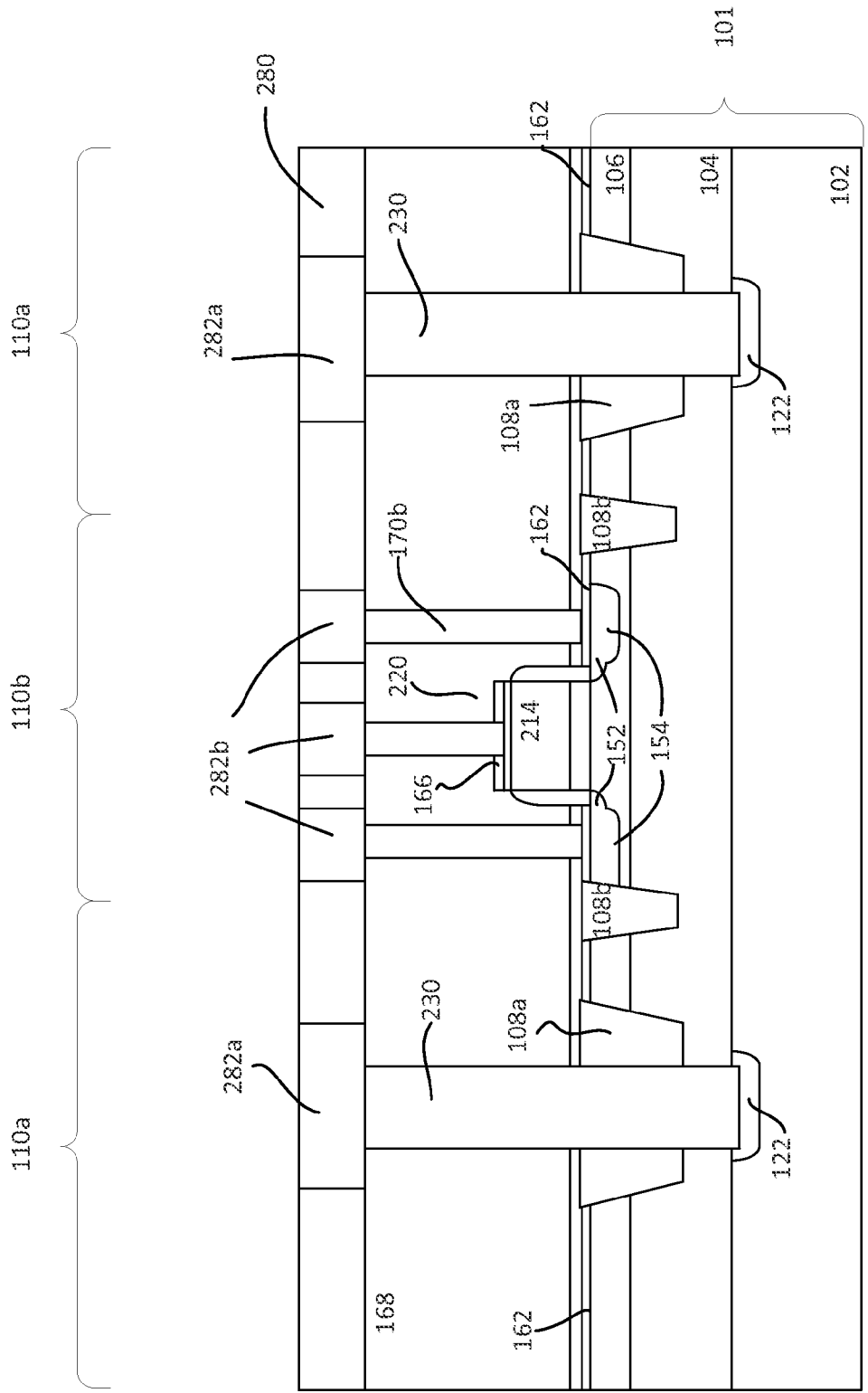

Referring to FIG. 4g, an IMD layer 280 is formed over the PMD layer. Trenches corresponding to conductive lines which are in communication with contact plugs and substrate contact structure in the PMD layer are formed. The materials, techniques and process parameters used for forming the IMD layer and conductive lines are the same as that described in FIG. 3k.

As shown, the substrate contact structure 230 is interconnected by first type conductive line 282a in the IMD layer. In the case where the substrate contact structure is in the form of a ring, the first type conductive line, in one embodiment, is in the form of a ring interconnected to ground or any desired potential. The first type conductive lines, in another embodiment, are island structures or individual conductive lines. The configuration or shape of the first type conductive line, for example, depends on the shape or configuration of the substrate contact structure. As for the contact plugs 170b, they are interconnected by second type conductive lines 282b. The contact plugs are coupled to respective second conductive lines in the IMD layer. For example, the contact plug disposed over the source region is coupled to the conductive line which is the source line while the contact plug disposed over the drain region is coupled to conductive line with suitable voltages. The contact plug disposed over the gate of the transistor is coupled to a gate line with suitable gate voltage. Other suitable configurations may also be useful. The first and second type conductive lines 282a and 282b include the same conductive or metal material.

The process as described in FIGS. 4a-4g shows that the via openings and the substrate contact opening are filled in separate process steps. This allows the contact plugs and substrate contact structure to be formed with different materials. In an alternative embodiment, the process 400 may be modified such that via openings in the second region may be left unfilled prior to forming the mask layer 442. In this alternative embodiment, the via openings and the substrate contact opening may be filled simultaneously after forming the doped regions 122. In such case, the contact plugs and the substrate contact structure may be formed with the same material.

The embodiment as described above result in advantages. For example, the processes as described allow a substrate contact structure to be formed. The substrate contact structure helps to connect or contact the support substrate to a desired potential. The support substrate, as described, is connected to a metal or conductive line with desired potential through the substrate contact structure to prevent charging of the support substrate at system level. Preferably, the support substrate is connected to a ground potential to prevent any erratic behavior on RF signals if the support or "handle" substrate (back plate) obtains any charge by any RF or DC coupling. In addition, the process as described in FIGS. 3a-3k enables the substrate contact structure and the gate of the transistor to be patterned simultaneously. This simplifies the manufacturing process. Furthermore, the methods of forming the substrate contact structures as described are easily integrated with current processes used for forming semiconductor devices. Thus, the embodiments as described provide a relatively simple and cost effective method for introducing substrate contact structures into devices utilizing, for example, SOI substrate.

The present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming a device comprising:
   providing a substrate having at least a first region and a second region prepared with isolation regions, wherein the first region is referred to as a chip guarding area and the second region defines a chip region of which at least one transistor is to be formed, wherein the substrate comprises a top surface layer, a support substrate and an insulator layer isolating the top surface layer from the support substrate;
   forming at least one transistor in the second region of the substrate;
   forming at least one substrate contact structure in the first region of the substrate, wherein the substrate contact structure passes through at least the top surface layer, insulator layer and isolation region and contacts a doped region in the support substrate in the first region of the substrate, and wherein the substrate contact structure is connected to at least one conductive line with a desired potential to prevent charging of the support substrate at system level.

2. The method of claim 1 wherein the top surface layer comprises a single crystalline silicon (Si) layer forming a silicon-on-insulator (SOI) substrate.

3. The method of claim 1 wherein the isolation region in the first region is wider than the isolation region in the second region of the substrate.

4. The method of claim 1 comprising forming gate layers of the at least one transistor over the substrate prior to forming the at least one substrate contact structure, wherein forming the gate layers comprises:
   forming a gate dielectric layer on the substrate; and
   forming a first gate electrode layer on the gate dielectric layer.

5. The method of claim 4 wherein:
   the first gate electrode layer comprises a thickness T1; and
   forming the at least one substrate contact structure comprises forming a substrate contact opening which extends from a top surface of the first gate electrode layer to at least a top surface of the support substrate.

6. The method of claim 5 wherein forming the substrate contact opening comprises:
   providing a mask layer having an opening in the first region;
   removing portions of the top surface layer, isolation region and insulator layer exposed by the opening by an etch process, wherein the etch process stops on the top surface of the support substrate.

7. The method of claim 5 comprising performing an implant into exposed portion of the support substrate to form the doped region.

8. The method of claim 5 comprising:
   providing a second gate electrode layer having a thickness T2 over the substrate and lines sidewalls and bottom of the substrate contact opening; and
   patterning the gate dielectric and gate electrode layers by mask and etch process to simultaneously form at least one gate of the at least one transistor in the second region and the least one substrate contact structure in the first region.

9. The method of 8 wherein:
   the at least one gate of the at least one transistor comprises a patterned gate dielectric and gate electrode having a combined thickness of T1 and T2; and
   the substrate contact structure comprises first portions which are formed over the top surface layer and a second portion lining the sidewalls and bottom of the substrate contact opening and contacts the doped region, wherein the first portions comprise both first and second gate electrode layers having a combined thickness of T1 and T2 and a dielectric isolating the first portions of the substrate contact structure from the top surface layer while the second portion comprises the second gate electrode layer having the thickness T2.

10. The method of claim 9 comprising:
    forming lightly doped diffusion regions adjacent to sidewalls of the gate of the transistor;
    forming sidewall spacers on sidewalls of the gate and sidewalls of the first portions of the substrate contact structure; and
    forming heavily doped diffusion regions in the top surface layer adjacent to the sidewall spacers of the gate.

11. The method of claim 9 comprising:
    forming a salicide block layer on the substrate, wherein the salicide block layer lines top surface of the second portion of the substrate contact structure and partially overlaps top surface of the first portions of the substrate contact structure; and
    forming silicide contacts on contact regions of the at least one transistor and contact regions on the at least one substrate contact structure.

12. The method of claim 11 comprising:
    forming an interlevel dielectric (ILD) layer which serves as pre-metal dielectric (PMD) layer over the substrate;
    forming first and second type contact plugs in the PMD layer;
    forming an intermediate dielectric (IMD) layer over the PMD layer; and forming the at least one conductive line in the IMD layer, wherein first type conductive line is coupled to first type contact plug which is in communication with contact region on the at least one substrate contact structure while second type conductive line is coupled to second type contact plug which is coupled to contact region of the at least one transistor.

13. The method of claim 4 wherein forming the at least one transistor comprising:
    patterning the gate layers by mask and etch process to form at least one gate of the at least one transistor in the second region;
    forming lightly doped diffusion regions adjacent to sidewalls of the gate of the transistor;
    forming sidewall spacers on sidewalls of the gate; and
    forming heavily doped diffusion regions in the top surface layer adjacent to the sidewall spacers of the gate.

14. The method of claim 13 comprising:
    forming an interlevel dielectric (ILD) layer which serves as pre-metal dielectric (PMD) layer over the substrate;
    forming contact plugs in the PMD layer, wherein the contact plugs are coupled to contact regions of the at least one transistor in the second region; and
    forming the at least one substrate contact structure after forming the PMD layer, wherein forming the at least one substrate contact structure comprises forming at least one substrate contact opening which extends from a top surface of the PMD layer to bottom of the insulator layer of the substrate.

15. The method of claim 14 wherein forming the at least one substrate contact structure comprises:
    providing a mask layer having an opening in the first region over the PMD layer;
    removing portions of the PMD layer, top surface layer, isolation region and insulator layer of the substrate exposed by the opening by an etch process to form the at least one substrate contact opening, wherein the etch process stops on top surface of the support substrate; and comprising
    filling the at least one substrate contact opening with a conductive material.

16. The method of claim 15 wherein the at least one substrate contact opening is in the form of a ring shape.

17. The method of claim 15 comprising:
    forming an intermediate dielectric (IMD) layer over the PMD layer; and
    forming the at least one conductive line in the IMD layer, wherein first type conductive line is coupled to the substrate contact structure which is in contact with the doped region in the support substrate while second type conductive line is coupled to the contact plug which is coupled to contact region of the at least one transistor.

18. The method of claim 17 wherein configuration or shape of the first type conductive line depends on configuration or shape of the substrate contact structure.

19. The method of claim 15 wherein the at least one substrate contact opening is in the form of a single or individual via or via bar opening.

20. The method of claim 1 wherein the substrate contact structure comprises:
    a substrate contact opening in the first region which extends from a top surface of the top surface layer to a bottom of the insulator layer; and
    first portions which are disposed over the top surface layer and a second portion lining sidewalls and bottom of the substrate contact opening and contacts the doped region, wherein the substrate contact structure comprises the same composition as a gate of the at least one transistor.

21. A device comprising:
    a substrate having at least a first region and a second region prepared with isolation regions, wherein the first region is referred to as a chip guarding area and the second region defines a chip region of which at least one transistor is to be disposed, wherein the substrate comprises a top surface layer, a support substrate and an insulator layer isolating the top surface layer from the support substrate;
    at least one transistor disposed in the second region of the substrate;
    at least one substrate contact structure disposed in the first region of the substrate, wherein the substrate contact structure passes through at least the top surface layer, insulator layer and isolation region and contacts a doped region in the support substrate in the first region of the substrate, and wherein the substrate contact structure is coupled to at least one conductive with a desired potential to prevent charging of the support substrate at system level.

22. The device of 21 having a substrate contact opening in the first region which extends from a top surface of the top surface layer to a bottom of the insulator layer, wherein:
    the substrate contact structure comprises first portions which are disposed over the top surface layer and a second portion lining sidewalk and bottom of the substrate contact opening and contacts the doped region, wherein the substrate contact structure comprises the same composition as a gate of the at least one transistor.

23. The device of claim 21 comprising:
    an interlevel dielectric (ILD) layer which serves as premetal dielectric (PMD) layer over the substrate, wherein the PMD layer comprises contact plugs coupled to contact regions of the at least one transistor in the second region; and wherein
    the at least one substrate contact structure has at least one substrate contact opetring which extends from a top surface of the PMD layer to bottom of the insulator layer of the substrate.

\* \* \* \* \*